(12) United States Patent
Russell et al.

(10) Patent No.: US 9,156,682 B2
(45) Date of Patent: Oct. 13, 2015

(54) METHOD OF FORMING ORIENTED BLOCK COPOLYMER LINE PATTERNS, BLOCK COPOLYMER LINE PATTERNS FORMED THEREBY, AND THEIR USE TO FORM PATTERNED ARTICLES

(75) Inventors: Thomas P. Russell, Amherst, MA (US); Sung Woo Hong, Amherst, MA (US); Doug Hyun Lee, Amherst, MA (US); Soojin Park, Ulsan (KR); Ting Xu, Berkeley, CA (US)

(73) Assignees: THE UNIVERSITY OF MASSACHUSETTS, Boston, MA (US); THE REGENTS OF THE UNIVERSITY OF CALIFORNIA, Oakland, CA (US); UNIST ACADEMY-INDUSTRY RESEARCH CORPORATION (KR)

( * ) Notice: Subject to any disclaimer, the term of this patent is extended or adjusted under 35 U.S.C. 154(b) by 754 days.

(21) Appl. No.: 13/480,506

(22) Filed: May 25, 2012

(65) Prior Publication Data
US 2012/0301677 A1    Nov. 29, 2012

Related U.S. Application Data

(60) Provisional application No. 61/489,894, filed on May 25, 2011.

(51) Int. Cl.
*B05D 3/02* (2006.01)
*B81C 1/00* (2006.01)
*B05D 3/10* (2006.01)
*B05D 5/02* (2006.01)

(52) U.S. Cl.
CPC ............. *B81C 1/00031* (2013.01); *B05D 3/10* (2013.01); *B05D 3/107* (2013.01); *B81C 1/00055* (2013.01); *B81C 1/00063* (2013.01); *B81C 1/00071* (2013.01); *B81C 1/00079* (2013.01); *B05D 3/0254* (2013.01); *B05D 5/02* (2013.01); *B81C 2201/0149* (2013.01); *Y10T 428/24521* (2015.01)

(58) Field of Classification Search
None
See application file for complete search history.

(56) References Cited

U.S. PATENT DOCUMENTS

| 5,079,268 A | 1/1992 | Nelissen et al. |
| 5,314,569 A | 5/1994 | Pribat et al. |

(Continued)

FOREIGN PATENT DOCUMENTS

| GB | 1294406 | 10/1972 |
| WO | 2007038381 A2 | 4/2007 |

OTHER PUBLICATIONS

Kim et al., "Salt Complexation in Block Copolymer Thin Films", Macromolecules 39, 2006, pp. 8473-8479.

(Continued)

*Primary Examiner* — Erma Cameron
(74) *Attorney, Agent, or Firm* — Cantor Colburn LLP

(57) ABSTRACT

A block copolymer film having a line pattern with a high degree of long-range order is formed by a method that includes forming a block copolymer film on a substrate surface with parallel facets, and annealing the block copolymer film to form an annealed block copolymer film having linear microdomains parallel to the substrate surface and orthogonal to the parallel facets of the substrate. The line-patterned block copolymer films are useful for the fabrication of magnetic storage media, polarizing devices, and arrays of nanowires.

23 Claims, 13 Drawing Sheets

(56) References Cited

U.S. PATENT DOCUMENTS

| | | | |
|---|---|---|---|
| 5,772,905 | A | 6/1998 | Chou |
| 6,635,904 | B2 | 10/2003 | Goetz et al. |
| 6,746,825 | B2 | 6/2004 | Nealey et al. |
| 6,858,521 | B2 | 2/2005 | Jin |
| 6,893,705 | B2 | 5/2005 | Thomas et al. |
| 6,926,953 | B2 | 8/2005 | Nealey et al. |
| 6,943,117 | B2 | 9/2005 | Jeong et al. |
| 7,030,167 | B2 | 4/2006 | Gunther |
| 7,081,269 | B2 | 7/2006 | Yang et al. |
| 7,109,249 | B2 | 9/2006 | Bruza et al. |
| 7,138,325 | B2 | 11/2006 | Maleville et al. |
| 7,189,435 | B2 | 3/2007 | Tuominen et al. |
| 7,190,049 | B2 | 3/2007 | Tuominen et al. |
| 7,517,466 | B2 | 4/2009 | Asakawa et al. |
| 7,544,578 | B2 | 6/2009 | Clevenger et al. |
| 7,632,544 | B2 | 12/2009 | Ho et al. |
| 2004/0124092 | A1 | 7/2004 | Black et al. |
| 2004/0175628 | A1 | 9/2004 | Nealey et al. |
| 2005/0235906 | A1 | 10/2005 | Legagneux et al. |
| 2006/0093954 | A1 | 5/2006 | Moudry et al. |
| 2006/0205875 | A1* | 9/2006 | Cha et al. ............. 525/88 |
| 2006/0257565 | A1 | 11/2006 | Jin et al. |
| 2006/0292870 | A1 | 12/2006 | Pribat |
| 2007/0153222 | A1 | 7/2007 | Jo et al. |
| 2008/0014528 | A1 | 1/2008 | Bailey et al. |
| 2008/0230514 | A1 | 9/2008 | Park et al. |
| 2008/0311402 | A1* | 12/2008 | Jung et al. ............. 428/409 |
| 2008/0315270 | A1 | 12/2008 | Marsh et al. |
| 2009/0087664 | A1 | 4/2009 | Nealey et al. |
| 2010/0075116 | A1 | 3/2010 | Russell et al. |
| 2010/0086801 | A1 | 4/2010 | Russell et al. |
| 2010/0112308 | A1 | 5/2010 | Russell et al. |
| 2011/0059299 | A1* | 3/2011 | Kim et al. ............. 428/195.1 |
| 2013/0302632 | A1 | 11/2013 | Russell et al. |

OTHER PUBLICATIONS

Kimura et al., "Long-Range Odering of Diblock Copolymers Induced by Droplet Pinning", Langmuir 19, 2003, pp. 9910-9913.
Kubo et al., "Characterization of pattern transfer in the fabrication of magnetic nanostructure arrays by block copolymer lithography", Applied Physics Letters 90, 2007, pp. 233113-1-233113-3.
Lammertink et al, "Nanostructured Thin Films of Organic-Organometallic Block Copolymers: One-Step Lithography with Poly(ferrocenylsilanes) by Reactive Ion Etching", Advance Materials, 12, 2000, 6 pages.
Lammertink et al., "Poly(ferrecenyldimethylsilanes) for Reactive Ion Etch Barrier Applications", Chem. Mater. 13, 2001, pp. 429-434.
Li et al., "Dense arrays of ordered GaAS nanostructures by selective area growth on substrates patterned by block copolymer lithography", Appl. Phys. Lett. 76, 2000, pp. 1689-1691.
Li et al., "Ordered Block-Copolymer Assembly Using Nanoimprint Lithography", Nano Letters, 4(9), 2004, pp. 1633-1636.
Li et al., Abstract for "Spatially Controlled Fabrication of Nanoporous Block Copolymers", Chem. Mater. 16(20), 2004, pp. 3800-3808.
Li et al., "Patternable Block Copolymers", Adv. Polym. Sci. 190, 2005, pp. 183-226.
Li et al., "Block copolymer patterns and templates", Materials Today, vol. 9, No. 9, 2006, pp. 30-39.
Lin et al., "A rapid Route to Arrays of Nanostructures in Thin Films", Adv. Mater. 14, No. 19, 2002, pp. 1373-1376.
Lin et al., "Self-directed self-assembly of nanoparticl/copolymer mixtures", Nature, vol. 434, 2005, pp. 55-59.
Lopes et al., "Hierarchial self-assembly of metal nanostructures on diblock copolymer scaffolds", Nature, vol. 414, 2001, pp. 735-738.
Ludwigs et al., "Self-assembly of functional nanostructures from ABC triblock copolymers", Nature Materials, vol. 2, 2003, pp. 744-747.
Maier et al., "Plasmonics—A Route to Nanoscale Optical Devices", Adv. Mater. 13, No. 19, 2001, pp. 1501-1505.

Mansky et al., "Controlling Polymer-Surface Interactions with Random Copolymer Brushes", Science 275, 1997, 1457-1460.
Mansky et al, "Large-Area Domain Alignment in Block Copolymer Thin Films Using Electric Fields", Macromolecules 31, 1998, p. 4399-4401.
Mayes et al., "Tailored Polymer Surfaces", MRS Bulletin, 1997, pp. 43-47.
Meli et al., "Self-Assembled Masks for the Transfer of nanometer-Scale Patterns into Surfaces: Characterization by AFM and LFM", Nano Letters, vol. 2, No. 2, 2002, pp. 131-135.
Morikawa et al., "Optical Alignment and Patterning of Nanoscale Microdomains in a Block Copolymer Thin Film", Adv. Mater. 18, 2006, pp. 883-886.
Morkved et al, "Local Control of Microdomain Orientations in Diblock Copolymer Thin Filmes with Electric Fields", Science, vol. 273, 1996, p. 931-933.
Park et al. "Block Copolymer Lithography", Science, vol. 276, 1997, 1401-1404.
Park et al., "Large area dense nanoscale patterning of arbitrary surfaces", Applied Physics Letters, vol. 79, No. 2, 2001, pp. 257-259.
Park et al., "Double textured cylindrical block copolymer domains via directional solidification on a topographyically patterned substrate", Applied Physics Letters, vol. 79, No. 6, 2001, pp. 848-850.
Park et al., "Large area orientation of block copolymer microdomains in this films via directional crystallization of a solvent", Macromolecules 34, 2001, pp. 2602-2606.
Park et al., "Solvent-Induced Transition from Micelles in Solution to Cylindrical Microdomains in Diblock Copolymer Thin Films", Macromolecules 40, 2007, pp. 9059-9063.
Park et al., Abstract for "Fabrication of Highly Ordered Silicon Oxide Dots and Stripes from Block Copolymer Thin Films", Advanced Materials, vol. 20, Issue 4, 2008, pp. 681-685.
Park et al., "From Nanorings to Nanodots by Patterning with Block Copolymers", Nano Letters, vol. 8, No. 6, 2008, pp. 1667-1672.
Park et al., "A simple route to highly oriented and rodered nanoporous block copolymer templates", ACS Nano, vol. 2, No. 4, 2008, pp. 766-772.
Park et al., "Macroscopic 10-Terabit-per-Square-Inch Arrays from Block Copolymers with Lateral Order", Science, vol. 323, 2009, pp. 1030-1033.
International Search Report and Written Opinion for International Application No. PCT/US2008/057187, International Filing Date Mar. 17, 2008, Date of Mailing Apr. 8, 2008, 16 pages.
Pelletier et al., "Aluminum nanowire polarizing grids: Fabrication and analysis", Applied Physics Letters 88, 2006, pp. 211114-1-211114-3.
Pereira et al, "Diblock Copolymer Thin Film Melts on Striped, Heterogeneous Surfaces: Parallel, Perpendicular and Mixed Lamellar Morphologies", Macromolecules 32, 1999, p. 758-764.
Rockford et al., "Polymers on Nanoperiodic, Heterogeneous Surfaces", Physical Review Letters, vol. 82, No. 12, 1999, pp. 2602-2605.
Rockford et al., "Propagation of Nanopatterned Substrate Templated Ordering of Block Copolymers in Thick Films", Macromolecules 34, 2001, pp. 1487-1492.
Ross, "Patterned Magnetic Recording Media", Annu. Rev. Mater. Res. 31, 2001, pp. 203-235.
Russell et al., "Small Angle Neutron Scattering Studies on Ultrathin Films", Macromolecules 28, 1995, pp. 787-789.
Russell et al, "Block Copolymers as Nanoscopic Templates", Macromol. Symp. 159, 2000, p. 77-88.
Segalman et al., "Graphoeitaxy of Spherical Domain Block Copolymer Films", Adv. Mater. 13, 2001, pp. 1152-1155.
Segalman, "Patterning with block copolymer thin films", Materials Science and Engineering R 48, 2005, pp. 191-226.
Sohn et al., "Sluggish Development fo Parallel Lamellae at the Strongly Interacting Interface in Thin Films of Symmetric Diblock Copolymers", Langmuir 18, 2002, pp. 10505-10508.
Sohn et al., "Directed Self-Assembly of Two Kinds of Nanoparticles Utilizing Monolayer Films of Diblock Copolymer Micelles", J. Am. Chem. Soc. 125, 2003, pp. 6368-6369.

(56) References Cited

OTHER PUBLICATIONS

Song et al., "Faceting Kinetics of Stepped Si(113) Surfaces: A Time-Resolved X-Ray Scattering Study", Physical Review Letters, vol. 74, No. 26, 1995, pp. 5240-50243.
Song et al., "Attractive step-step interactions, tricriticality, and faceting in the orientational phase diagram of silicon surfaces between [113] and [114]", Physical Review B, vol. 51, No. 15, 1995, pp. 10 069-10 085.
Spatz et al., "Ultrathin Diblock Copolymer/Titanium Laminates—A Tool for Nanolithography", Advanced Materials 10, 1998, pp. 849-852.
Spatz et al, "Micellar Inorganic—Polymer Hybrid Systems—A Tool for Nanolithography", Advanced Materials 11, No. 2, 1999, p. 149-153.
Spatz et al., "A Combined Top-Down/Bottom-Up Approach to the Microscopic Localization of Metallic Nanodots", Advanced Materials, vol. 14, No. 24, 2004, pp. 1827-1832.
Stoykovich et al., "Directed Assembly of Block Copolymer Blends into Nonregular Device-Oriented Structures", Science 308, 2005, pp. 1442-1446.
Stoykovich et al, "Block copolymers and conventional lithography", Materials Today, vol. 9, No. 9, 2006, p. 20-29.
Tang et al., "Long-Range Ordered Thin Films of Block Copolymers Prepared by Zone-Casting and Their Thermal Conversion into Ordered Nanostructured Carbon", J. Am. Chem. Soc. 127, 2005, pp. 6918-6919.
Temple et al, "Spontaneous Vertical Ordering and Pyrolytic Formation of Nanoscopic Cermaic Patterns from Poly (styrene-b-ferrocenysilane)", Advanced Materials 15, 2003, 13 pages.
Thompson et al., "Predicting the mesophases of Copolymer-Nanoparticle Composites", Science 292, 2001, pp. 2469-2472.
Thurn-Albrecht et al., "Overcoming Interfacial Interactions with Electric Fields", Macromolecules 33, 2000, pp. 3250-3253.
Thurn-Albrecht et al, "Nanoscopic Templates from Oriented Block Copolymer Films", Advance Materials 12, 2000, 4 pages.
Thurn-Albrecht et al., "Ultrahigh-Density Nanowire Arrays Grown in Self-Assembled Diblock Copolymer Templates", Science 290, 2000, pp. 2126-2129.
U.S. Appl. No. 12/049,541 Final Office Action, filed Mar. 17, 2008, Notification Date Jul. 6, 2011, 12 pages.
U.S. Appl. No. 12/049,541 Non-Final Office Action, filed Mar. 17, 2008; Notification Date Mar. 1, 2011, 18 pages.
U.S. Appl. No. 13/461,175, filed with the USPTO May 1, 2012.
Villar et al., "Study of oriented block copolymers films obtained by roll-casting", Polymer 43, 2002, 5139-5145.
Wang et al., "Simulations of the Morphology of Cylinder-Forming Asymmetric Diblock Copolymer Thin Films on Nanopatterned Substrates", Macromolecules 36, 2000, pp. 1731-1740.
Wang et al, "One step fabrication and characterization of platinum nanopore electrode ensembles formed via amphiphilic block copolymer self-assembly", Electrochimica Acta, 52, 2006, p. 704-709.
Williams et al, "Etch Rates for Micromachining Processing—Part II", J. Micro. Sys. vol. 12, No. 6, 2003, p. 761-778.
Wyrwa et al., "One-Dimensional Arrangements of Metal Nanoclusters", Nano Letters, vol. 2, No. 4, 2002, pp. 419-421.
Xu et al, "The influence of molecular weight on nanoporous polymer films", Polymer 42, 2001, p. 9091-9095.
Xu et al., "Block Copolymer Surface Reconstruction: A Reversible Route to Nanoporous", Adv. Funct. Mater. 13, No. 9, 2003, pp. 698-702.
Xu et al., "Interfacial Energy Effects on teh Electric Field Alignment of Symmetric Diblock Copolymers", Macromolecules 36, 2003, pp. 6178-6182.
Yang et al, "Guided Self-Assembly of Symmetric Diblock Copolymer Films on Chemically Nanopatterned Substrates", Macromolecules 33, 2000, p. 9575-9582.
Zalusky et al, "Mesoporous Polystyrene Monoliths", J. Am. Chem. Soc. 123, 2001, p. 1519-1520.

Ansari et al., "Templating the patterning of gold nanoparticles using a stained triblock copolymer film surface", J. Mater. Chem. 13, 2003, pp. 2412-2413.
Asakawa et al, "Nano-Patterning for Patterned Media Using Block-Copolymer", Journal of Photopolymer Science and Technology, vol. 15, No. 2, 2002, p. 465-470.
Bal et al, "Nanofabrication of integrated magnetoelectronic devices using patterned self-assembled copolymer templates", Applied Physics Letters vol. 81, No. 18, 2002, p. 3479-3481.
Black et al., "Spin-Dependent Tunneling in Self-Assembled Cobalt-nanocrystal Superlattices", Science 290, 2000, pp. 1131-1134.
Black et al, "Integration of self-assembled diblock copolymers for semiconductor capacitor fabrication", Applied Physics Letters, vol. 79, No. 3, 2001, p. 409-411.
Black, "Nanometer-Scale Pattern Registration and Alignment by Directed Diblock Copolymer Self-Assembly", IEEE Transactions of Nanotechnology, vol. 3, No. 3, 2004, pp. 412-415.
Bockstaller et al., "Block Copolymer Nanocomposites: Perspectives for Tailored Functional Materials", Advanced Materials, 17, 2005, pp. 1331-1349.
Bodycomb et al. "Single-Grain Lamellar Microdomain from a Diblock Copolymer", Macromolecules 32, 1999, pp. 2075-2077.
Chan et al, "Ordered Bicontinuous Nanoporous and Nanorelief Ceramic Films from Self Assembling Polymer Precursors", Science 286, 1999, p. 1716-1719.
Cheng et al, "Formation of a Cobalt Magnetic Dot Array via Block Copolymer Lithography", Advanced Materials 13, 2001, 5 pages.
Cheng et al., "Fabrication of nanostructures with long-range order using block copolymer lithograhy", Applied Physics Letters, vol. 81, No. 19, 2002, pp. 3657-3659.
Cheng et al., Abstract of "A Highly Regular Two-Dimensional Array of Au Quantum Dots Deposited in a Periodically Nanoporous GaAs Epitaxial Layer", Adv. Mater. 14, 2002, p. 1567.
Chiu et al., "Control of Nanoparticle Location in Block Copolymers", Adv. Mater. 127, 2005, pp. 5036-5037.
Chou et al., "Sub-10 nm imprint lithography and applications", J. Vac. Sci. Technol. B 15(6), 1997, pp. 2897-2904.
De Rosa et al, "Microdomain patterns from directional eutectic solidification and epitaxy", Nature 405, 2000, 5 pages.
Drockenmuller et al., "Covalent Stabilization of Nanostructures: Robust Block Copolymer Templates from Novel Thermoreactive Systems", J. Polymer Sci. Part A: Polymer Chemistry, vol. 43, 2005, pp. 1028-1037.
Du et al, "Additive-Driven Phase-Selective Chemistry in Block Copolymer Thin Films: The Convergence of Top-Down and Bottom-Up Approaches", Advanced Materials, vol. 16, No. 12, 2004, p. 953-957.
Elhadji et al., "Orientation of self-assembled block copolymer cylinders perpendicular to electric field in mesoscale film", Applied Physics Letters, vol. 82, No. 6, 2003, p. 871-873.
Fan et al., "Semiconductor Nanowires: From Self-Organization to Patterned Growth", Small 2, No. 6, 2006, pp. 700-717.
Fasolka et al., "Observed Substrate Topography—Mediated Lateral Patterning of Diblock Copolymer Films", Physical Review Letters, vol. 79, No. 16, 1997, pp. 3018-3021.
Fasolka et al, "Block Copolymer Thin Films: Physics and Applications", Ann. Rev. Mater. Res. 31, 2004, 18 pages.
Feldheim et al., "Electron Transfer in Self-Assembled Inorganic Polyelectrolyte/metal Nanoparticle Heterostructures", J. Am. Chem. Soc. 1996, 118, pp. 7640-7641.
Fukunaga et al, "Large-Scale Alignment of ABC Block Copolymer Microdomains via Solvent Vapor Treatment", Macromolecules 33, 2000, p. 947-953.
Fukutani et al, "Ultrahigh Pore Density Nanoporous Films Produced by the Phase Separation of Eutectic Al—Si for Template-Assisted Growth of Nanowire Arrays", Advanced Materials, vol. 16, No. 16, 2004, p. 1456-1460.
Gaubert et al, "Highly parallel fabrication of nanopatterned surfaces with nanoscale orthogonal biofunctionalization imprint lithography", Nanotechnology, 18, 2007, p. 1-7.
Gibson, "Reading and Writing with Electron Beams", Physics Today, 1997, pp. 56-61.

(56) References Cited

OTHER PUBLICATIONS

Glass et al., "Block copolymer micelle nanolithography on non-conductive substrates", New Journal of Physics 6, 2004, pp. 1-17.
Golzhauser et al., "Chemical Nanolithography with Electron Beams", Adv. Material 13, No. 11, 2001, pp. 806-809.
Gorzolnik et al., "Nano-structured micropatterns by combination of block copolymer self-assembly and UV photolithography", Nanotechnology 17, 2006, pp. 5027-5032.
Guarini et al, "Nanoscale patterning using self-assembled polymers for semiconductor applications", J. Vac. Sci. Tech. B 19, 2001, 5 pages.
Guarini et al., "Process integration of self-assembled polymer templates into silicon nanofabrication", J. Vac. Sci. Technol. B 20(6), 2002, pp. 2788-2792.
Hahm et al., "Cylinder Alignment in Annular Structures of Microphase-Separated Polystyrene-b-Poly(methyl methacrylate)", Langmuir 16, 2000, pp. 4766-4769.
Hamley, "Nanotechnology with Soft Materials", Angew. Chem. Int. Ed. 42, 2003, pp. 1692-1712.
Harrison et al, "Lithography with a mas of block copolymer microstructures", J. Vac. Sci. Technol. B 16(2), 1998, p. 544-552.
Hartney et al, "Block copolymers as bilevel resists", J. Vac. Sci. Tech. B 3, 1985, p. 1346-1351.
Haryono et al., Abstract for "Controlled Arrangement of Nanoparticle Arrays in Block-Copolymer Domains", Small, vol. 2, Issue 5, 2006, pp. 6008-611.
Haupt et al, "Nanoporous Gold Films Created using Templates Formed from Self-Assembled Structures of Inorganic-Block Copolymer Micelles", Advance Materials 15, 2003, 3 pages.
Hawker et al., "Block Copolymer Lithography: Merging "Bottom-Up" with "Top-Down" Processes", MRS Bulletin, vol. 30, 2005, pp. 952-966.
Heier et al, "Thin Diblock Copolymer Films on Chemically Heterogeneous Surfaces", Macromolecules 30, 1997, pp. 6610-6614.
Heier et al., "Transfer of a chemical substrate pattern into an island-forming diblock copolymer film", Journal of Chemical Physics, vol. 111, No. 24, 1999, pp. 11101-11110.
Ho et al., "Solvent-induced microdomain orientation in polystyrene-b-poly(L-lactide) diblock copolymer thin films for nanopatterning", Polymer 46, 2005, pp. 9362-9377.
Honda et al., "Impedance Characteristics of the Nanoporous Honeycomb Diamond Electrodes for Electrical Double-Layer Capacitor Applications", Journal of the Electrochemical Society, 148(7), 2001, pp. A668-A679.
Huang et al, "Modeling copolymer Adsorption on laterally Hetergeneous Surfaces", Physical Review Letters, vol. 66, No. 5, 1991, p. 620-623.
Huang et al., "Nanodomain control in copolymer thin films", Nature, vol. 395, 1998, pp. 757-758.
Jaramillo et al., "Catalytic Activity of Supported Au Nanoparticles Deposited from Block Copolymer Micelles", J. Am. Chem. Soc. 125, 2003, pp. 7148-7149.
JP2001189466, EPO Abstract, Oct. 7, 2001, 2 pages.
Kim et al., "Phase transition behavior in thin films of block copolymers by use of immiscible solvent vapors", Soft Matter 7, 2001, pp. 443-447.
Kim et al, "Epitaxial self-assembly of block copolymers on lithographically defined nanopatterned substrates", Nature 424, 2003, p. 411-414.
Kim et al., "Highly Oriented and Ordered Arrays from Block Copolymers via Solvent Evaporation", Advanced Materials, 16, No. 3, 2004, pp. 226-231.
Kim et al., Abstract for "Nanoparticle-Induced Phase Transitions in Diblock-Copolymer Films", Advanced Materials, vol. 17, Issue 21, 2005, pp. 2618-2622.
U.S. Appl. No. 13/546,378, filed with the USPTO Jul. 6, 2012.
Park et al., "Enabling nanotechnology with self assembled block copolymer patterns", Polymer, 44, 2003, pp. 6725-6760.
Campo et al., Fabrication Approaches for Generating Complex Micro- and Nanopatterns on Polymeric Surfaces, Chem. Rev. 2008, 108, 911-945.
Non Final Office Action for U.S. Appl. No. 13/944,329, filed Jul. 17, 2013; Notification Date Mar. 10, 2015; 36 pages.
Final Office Action dated Dec. 31, 2014; U.S. Appl. No. 14/048,073, filed Oct. 8, 2013; 6 pages.
Kim et al, "Morphological Development in Solvent-Cast Polystyrene-Polybutadiene-Polystyrene (SBS) Triblock Copolymer Thin Films", Macromolecules, 31, 1998, p. 2569-2577.
Non-Final Office Action dated Jan. 23, 2015; U.S. Appl. No. 13/546,378, filed Jul. 11, 2012 (22 pages).
Non-Final Office Action dated Oct. 31, 2014; U.S. Appl. No. 14/048,073, filed Oct. 8, 2013; (29 pages).
Segalman et al., "Ordering and Melting of Block Copolymer Spherical Domains in 2 and 3 Dimensions", Macromolecules, 2003, 36(9), 3272-3288.
Final Office Action for U.S. Appl. No. 13/944,329, filed Jul. 17, 2013; Notification Date Jun. 25, 2015; 11 pages.

\* cited by examiner

METHOD OF FORMING ORIENTED BLOCK COPOLYMER LINE PATTERNS, BLOCK COPOLYMER LINE PATTERNS FORMED THEREBY, AND THEIR USE TO FORM PATTERNED ARTICLES

CROSS REFERENCE TO RELATED APPLICATION

This application claims the benefit of U.S. Provisional Application Ser. No. 61/489,894 filed May 25, 2011, which is hereby incorporated by reference in its entirety.

STATEMENT REGARDING FEDERALLY SPONSORED RESEARCH & DEVELOPMENT

This invention was made with government support under Grant No. DE-FG02-96ER45612 awarded by the Department of Energy, Office of Basic Energy Sciences; and MRSEC on Polymers Grant No. DMR-0213695 awarded by the National Science Foundation. The government has certain rights in the invention.

BACKGROUND OF THE INVENTION

With the ever diminishing size scale of device elements, the directed self-assembly of block copolymers (BCPs), a highly parallel process, offers a simple, robust, and rapid route for generating nanostructured materials that overcomes the intrinsic technological and economic limits associated with large-scale "top down" lithographic approaches. See, e.g., J. Bang, U. Jeong, D. Y. Rue, T. P. Russell, C. J. Hawker, *Advanced Materials*, volume 21, page 1 (2009). The future of the directed self-assembly hinges on the ability to manipulate self-assemblies over large areas in an efficient, cost-effective manner and to make block copolymer self-assemblies compatible with industrial strategies like roll-to-roll processing and nanoimprint lithography.

Addressable arrays of elements with perfect, long-range lateral ordering, though essential for some applications, have yet to be achieved by self-assembly over macroscopic areas. A nanoscopic line pattern, though the simplest pattern and a key element for semiconductor, magnetic, and optical devices, is still a challenge to prepare over large areas. See, e.g., H.-C. Kim, C. T. Rettner, L. Sundström, *Nanotechnology*, volume 19, page 235301 (2008); and V. Pelletier, K. Asakawa, M. Wu, D. H. Adamson, R. A. Register, P. M. Chaikin, *Applied Physics Letters*, volume 88, page 211114 (2006). Chemical and topographic patterning and shearing have been used to direct the ordering and orientation of cylindrical and lamellar BCP microdomains. See, e.g., H.-C. Kim, C. T. Rettner, L. Sundström, *Nanotechnology, volume* 19, page 235301 (2008); R. A. Segalman, H. Yokoyama, E. J. Kramer, *Advanced Materials*, volume 13, page 1152 (2001); R. Ruiz, H. Kang, F. A. Detcheverry, E. Dobisz, D. S. Kercher, T. R. Albrecht, J. J. de Pablo, P. F. Nealey, *Science*, volume 321, page 936 (2008); M. A. Villar, D. R. Rueda, F. Ania, E. L. Thomas, *Polymer*, volume 43, page 5139 (2002); I. Bita, J. K. W. Yang, Y. S. Jung, C. A. Ross, E. L. Thomas, K. K. Berggren, *Science*, volume 321, page 939 (2008); J. Y. Cheng, A. M. Mayes, C. A. Ross, *Nature Materials*, volume 3, page 823 (2004); L. Rockford, Y. Liu, P. Mansky, T. P. Russell, M. Yoon, S. G. J. Mochrie, *Physical Review Letters*, volume 82, page 2602 (1999); L. Rockford, S. G. J. Mochrie, T. P. Russell, *Macromolecules*, volume 34, page 1487 (2001); S. O. Kim, H. H. Solak, M. P. Stoykovich, N. J. Ferrier, J. J. de Pablo, P. F. Nealey, *Nature*, volume 424, page 411 (2003); S. Xiao, X. Yang, E. W. Edwards, Y.-H. La, P. F. Nealey, *Nanotechnology*, volume 16, page 5324 (2005); D. E. Angelescu, J. H. Waller, D. H. Adamson, P. Deshpande, S. Y. Chou, R. A. Register, P. M. Chaikin, *Advanced Materials*, volume 16, page 1736 (2004); Y. S. Jung, C. A. Ross, *Nano Letters*, volume 7, page 2046 (2007). While shearing is the only technique that can produce nanoscopic line patterns over areas greater than one square-millimeter in a rapid, cost-effective manner, it is limited by the thickness of the films required and defects, like dislocations. Consequently, obtaining one-dimensional arrays of lines with perfect order over macroscopic areas represents an unmet challenge.

Single grains of hexagonally packed cylindrical microdomains oriented normal to the surface in BCP thin films have been prepared over macroscopic areas using the faceted surfaces of reconstructed, single-crystalline materials, like sapphire and silicon, or their replicas on polymer surfaces. See, e.g., S. Park, D. H. Lee, J. Xu, B. Kim, S. W. Hong, U. Jeong, T. Xu, T. P. Russell, *Science*, volume 323, page 1030 (2009); and S. Park, D. H. Lee, T. P. Russell, *Advanced Materials*, volume 22, page 1882 (2010). Perfection in the orientational order of the lattice was achieved, but only improved local translational order. The faceted surface topography could be transferred to the surface of a broad range of inexpensive, flexible polymeric substrates with exceptional fidelity, making the process amenable to roll-to-roll and nanoimprint and capillary force lithographic processes. S. Park, D. H. Lee, T. P. Russell, *Advanced Materials*, volume 22, page 1882 (2010). Only the size of the single crystal limited the area over which such ordered arrays could be produced. Consequently, the atomic level ordering of a single crystal could be transferred to the ordering of the BCP microdomains through the surface facets. However, long-range translational order was not realized for hexagonally-packed cylindrical microdomains oriented normal to the surface. There therefore remains a need for methods of forming nanoscopic line patterns with high degrees of long-range order over macroscopic areas.

BRIEF DESCRIPTION OF EMBODIMENTS OF THE INVENTION

One embodiment is a method of preparing a block copolymer film comprising a line pattern, comprising: forming a block copolymer film on a substrate surface comprising parallel facets; and annealing the block copolymer film to form an annealed block copolymer film comprising linear microdomains parallel to the substrate surface and orthogonal to the parallel facets; wherein the parallel facets of the substrate are characterized by a pitch $\lambda$; wherein the block copolymer in bulk comprises a hexagonal array of cylindrical microdomains characterized by a center-to-center spacing, $L_2$, of adjacent cylindrical microdomains; and wherein $\lambda/L_2$ is either less than or equal to 0.73 or greater than or equal to 1.4.

Another embodiment is a structured article prepared by the above-described method and comprising: a substrate comprising a surface comprising parallel facets characterized by a pitch, $\lambda$, corresponding to the separation between adjacent facets; and a block copolymer film comprising a surface contacting the substrate surface comprising parallel facets; wherein the block copolymer in bulk comprises a hexagonal array of cylindrical microdomains characterized by a center-to-center spacing, $L_2$, of adjacent cylindrical microdomains; wherein $\lambda/L_2$ is either less than or equal to 0.73 or greater than or equal to 1.4.

Another embodiment is a structured article, comprising: a substrate comprising a surface comprising parallel facets characterized by a pitch, λ, corresponding to the separation between adjacent facets; and a block copolymer film comprising a surface contacting the substrate surface comprising parallel facets; wherein the block copolymer in bulk comprises a hexagonal array of cylindrical microdomains characterized by a center-to-center spacing, $L_2$, of adjacent cylindrical microdomains; wherein $\lambda/L_2$ is either less than or equal to 0.73 or greater than or equal to 1.4.

These and other embodiments are described in detail below.

DETAILED DESCRIPTION OF THE INVENTION

Figure 1:
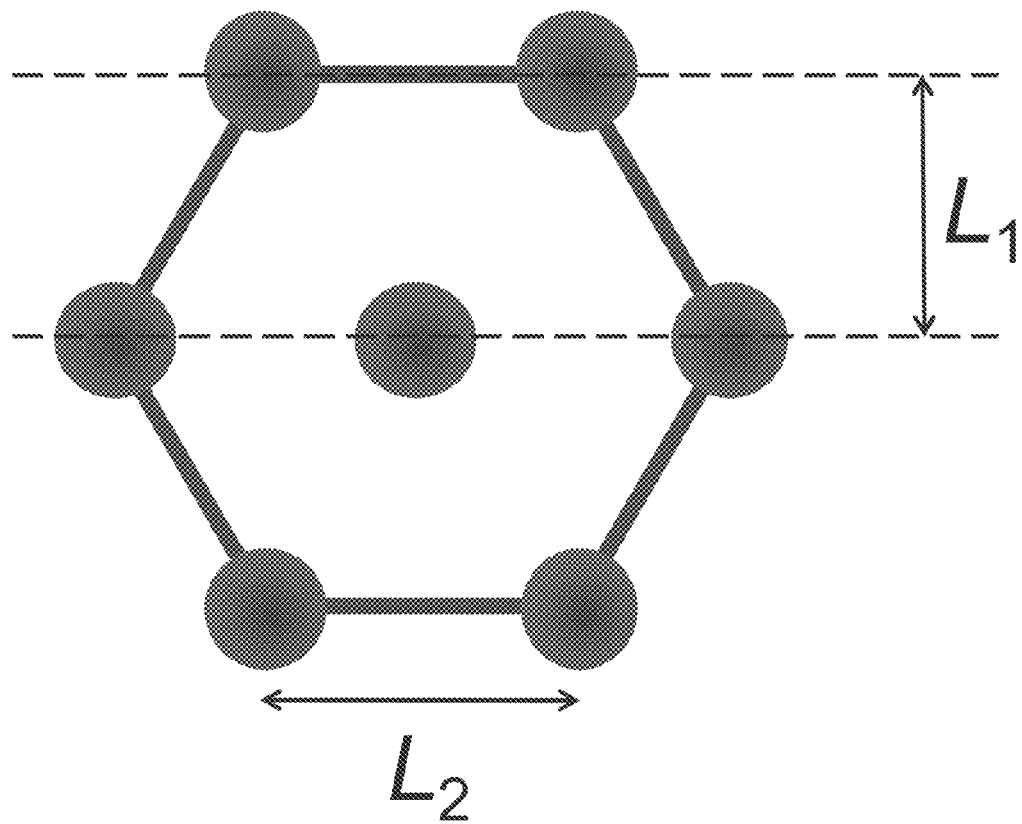
FIG. 1 depicts the dimensions $L_1$ and $L_2$ for a hexagonal array of cylinders in a bulk block copolymer.

In one embodiment of the invention, highly-ordered line patterns are produced using faceted surfaces by directing the self-assembly of nanoscopic cylindrical microdomains of block copolymers parallel to the surface in a thermodynamically robust manner. These faceted surfaces, which are quite imperfect due to the presence of dislocations and nonuniformities in between the ridges, are effective in aligning the cylindrical block copolymer microdomains, eliminating the short and long wavelength waviness that are inherent to the block copolymer microdomains on flat surfaces, and producing unidirectionally oriented line patterns with an order parameter of at least 0.95 over macroscopic areas.

One embodiment is a method of preparing a block copolymer film comprising a line pattern, comprising: forming a block copolymer film on a substrate surface comprising parallel facets; and annealing the block copolymer film to form an annealed block copolymer film comprising linear microdomains parallel to the substrate surface and orthogonal to the parallel facets; wherein the parallel facets of the substrate are characterized by a pitch λ; wherein the block copolymer in bulk comprises a hexagonal array of cylindrical microdomains characterized by a center-to-center spacing, $L_2$, of adjacent cylindrical microdomains; and wherein $\lambda/L_2$ is either less than or equal to 0.73 or greater than or equal to 1.4.

One step of the method is forming a block copolymer film on a substrate surface comprising parallel facets. In some embodiments, the substrate surface comprising parallel facets is an annealed, miscut surface of a crystalline substrate. In other embodiments, the substrate surface comprising parallel facets is a polymeric replica of a crystalline surface comprising parallel facets. In either case, the substrate surface provides a highly regular pattern of topographic features over large (at least square-centimeter) distances.

As noted above, in some embodiments, the substrate surface comprising parallel facets is an annealed, miscut surface of a crystalline substrate. The crystalline substrate can, optionally, consist essentially of a single crystal. In this context, the phrase "consists essentially of" allows levels of dopants and impurities that do not substantially detract from the regularity of the surface topology. One useful class of crystalline substrates includes crystalline silicon and doped crystalline silicon. Another useful class of crystalline substrates is crystalline aluminum oxides (which, in some forms, are known as "sapphire" or "corundum"). Before being annealed, the crystalline substrate is miscut. As used herein, the term "miscut" means that a crystal is cut to expose a surface that is unstable at elevated temperatures. In some embodiments, the crystal is cut at least 1 degree removed from any crystallographic plane of the crystalline substrate. In some embodiments, the crystalline surface is removed from any crystallographic plane by 1 to 10 degrees, specifically 2 to 8 degrees, more specifically 3 to 6 degrees. It will be understood that the term "miscut" includes some crystalline surfaces, such as miscut sapphire, that are conventionally defined with reference to a surface normal (rather than the surface plane). The miscut surface of the crystalline substrate is thermally annealed to form parallel facets. This means that the crystalline substrate is heated to a temperature at which regularly repeating facets are formed, then cooled to preserve that topology. For example, miscut silicon can be annealed by heating to a temperature of approximately 1262° C. for one minute, then rapidly cooling to 1027° C., followed by slow cooling to room temperature. As another example, miscut C-plane sapphire can be annealed by heating in air at 1100° C. for 10 hours, followed by cooling to room temperature. Methods of forming crystalline substrates with miscut, annealed surfaces are described in, for example, S. Song, S. G. J. Mochrie, and G. B. Stephenson, *Physical Review Letters*, volume 74, page 5240 (1995); and S. Song, and S. G. J. Mochrie, *Physical Review B*, volume 51, page 10068 (1995).

The crystalline surface comprises parallel facets. In some embodiments, the crystalline surface exhibits a sawtooth pattern. In some embodiments, the sawtooth pattern can be characterized by a peak-to-peak separation of about 24 to about 200 nanometers and a peak-to-valley separation of about 3 to about 20 nanometers. Within the range of about 24 to about 200 nanometers, the peak-to-peak separation can be about 30 to about 150 nanometers, specifically about 40 to about 120 nanometers, more specifically about 50 to about 100 nanometers. Within the range of about 3 to about 20 nanometers, the peak-to-valley separation can be about 5 to about 18 nanometers, specifically about 8 to about 15 nanometers. In some embodiments, the crystalline surface exhibits a grooved pattern. The grooved pattern can be characterized by a groove depth of about 3 to about 20 nanometers and a groove-to-groove separation of about 24 to about 200 nanometers. Within the range of about 3 to about 20 nanometers, the groove depth can be about 5 to about 18 nanometers, specifically about 8 to about 15 nanometers. Within the range of about 24 to about 200 nanometers, the groove-to-groove separation can be about 30 to about 150 nanometers, specifically about 40 to about 120 nanometers, more specifically about 50 to about 100 nanometers.

The topographically patterned crystalline surface can be chemically homogeneous. Alternatively, the topographically patterned crystalline surface can be chemically patterned. One example of a chemically patterned surface is a surface comprising stripes of oxide and metal. As background, see L. Rockford, Y. Liu, T. P. Russell, M. Yoon, and S. C. J. Mochrie, *Physical Review Letters*, volume 82, page 2602 (1999).

In some embodiments, the substrate surface comprising parallel facets is a polymeric replica of a crystalline surface comprising parallel facets. A variety of techniques can be used to form the polymeric replica in contact with the crystalline surface comprising parallel facets. In one replica-forming technique, an existing polymer film is contacted with the topographically patterned crystalline surface at a temperature greater than the glass transition temperature, $T_g$, of the polymer film material. The polymer film material can be amorphous, semicrystalline, or crystalline. If the polymeric film material is a semicrystalline or crystalline material having a melting temperature, T, contacting the polymer film with the topographically patterned crystalline surface is preferably conducted at a temperature less than $T_m$. When the polymer film is contacted with the topographically patterned crystalline surface, a pressure up to about 100 megapascals, specifically about 100 to about 300 kilopascals, can be applied to improve contact between the two layers. Alternatively, no pressure can be applied, and capillary force can be sufficient to draw the polymer into the valleys of the topographically patterned crystalline surface.

Another replica-forming technique comprises polymerizing a monomer composition in contact with the substrate surface comprising parallel facets. Any monomer composition that can be polymerized in the condensed state (i.e., in the absence of solvent) can be used. Suitable monomers can be deduced from the names of suitable polymers, listed below. The polymerization can occur by heating or exposure to radiation such as ultraviolet radiation, X-rays, or electron beams. Polymerization can be conducted with or without a catalyst. Examples of polymerizing a monomer composition include the polymerization of cyclic siloxanes to form polysiloxanes, the polymerization of acrylates to form polyacrylates, the polymerization of styrene (optionally in the presence of a crosslinker such as divinyl benzene) to form polystyrene, and the copolymerization of diols and diisocyanates to form polyurethanes.

Another replica-forming technique comprises reacting a first polymer in contact with the substrate surface comprising parallel facets to form a second polymer in contact with the substrate surface comprising parallel facets. Examples include reaction of polybutadiene or polyisoprene with chemical crosslinking agents to form crosslinked polybutadiene or crosslinked polyisoprene, reaction of unsaturated polyesters to form crosslinked polyesters, conversions of poly(amic acid)s to polyimides, and photochemical crosslinking of polyacetylenes.

Independent of the replica-forming technique, a wide variety of polymers can be used to form the polymeric replica, including thermoplastics, thermoplastic elastomers, elastomers, and thermosets. Thermoplastics include polycarbonates, polyesters (such as poly(ethylene terephthalate) and poly(butylene terephthalate)), polyamides, polyimides, polyetherimides, polyurethanes, polystyrenes, poly(phenylene ether)s, poly(phenylene sulfide)s, polyarylsulfones, polyethersulfones, poly(ether ketone)s, polyacrylates (including poly(methyl methacrylate) and poly(butyl acrylate)), poly (vinyl butyral), polyethylenes, polypropylenes, poly(vinyl acetate), polyacrylonitriles, poly(vinyl chloride), poly(vinyl fluoride), poly(vinylidene fluoride), polytetrafluoroethylenes, copolymers of vinylidene chloride and vinyl chloride, copolymers of vinyl acetate and vinylidene chloride, copolymers of styrene and acrylonitrile, and the like, and combinations thereof. Examples of thermoplastic elastomers include styrenic block copolymers, polyolefin blends, elastomeric alloys (including thermoplastic vulcanizates), thermoplastic polyurethanes, thermoplastic copolyesters, and the like, and combinations thereof. Elastomers include natural rubber, polybutadienes, polyisoprenes, copolymers of isobutylene and isoprene, copolymers of styrene and butadiene (styrene-butadiene rubber), copolymers of polybutadiene and acrylonitrile), polychloroprenes, copolymers of ethylene and propylene (ethylene-propylene rubber), polysiloxanes, fluorosilicone rubbers, polyether block amides, copolymers of ethylene and vinyl acetate, and the like, and combinations thereof. Thermosets include epoxy resins, cyanate ester resins, maleimide resins, benzoxazine resins, vinylbenzyl ether resins, alkene-containing monomers, alkyne-containing monomers, arylcyclobutene resins, perfluorovinyl ether resins, oligomers and polymers with curable vinyl functionality, and the like, and combinations thereof. Polymers particularly suitable for forming the polymeric replica include poly(ethylene terephthalate)s, poly(butylene terephthalate)s, polydimethylsiloxanes, polytetrafluoroethylenes, random copolymers of tetrafluoroethylene and hexafluoropropylene, and polyimides derived from pyromellitic dianhydride and 4,4'-oxydianiline.

One advantage of forming the block copolymer film on the polymeric replica rather than directly on the topographically patterned crystalline surface is that the polymeric replica can be flexible or even elastomeric. A flexible polymeric replica allows the use of roll-to-roll processing methods and the fabrication of curved (non-planar) high-density arrays. In some embodiments, the polymeric replica comprises a polymer has a flexural modulus of about 100 to about 10,000 megapascals, specifically 300 to 8,000 megapascals, more specifically 900 to 5,000 megapascals, measured at 23° C. according to ASTM D790-03, Procedure A.

When a solvent vapor is used to anneal the block copolymer film, the polymeric replica is preferably resistant to the annealing solvent. Thus, in some embodiments, the annealing the block copolymer film comprises annealing the block copolymer film in a vapor of an annealing solvent, and the polymeric replica comprises a polymer wherein a 100 micrometer thickness of the polymer is not worn through by 100 double rubs of a cloth saturated with the annealing solvent, conducted according to ASTM D5402-06, Method A.

The glass transition temperature, $T_g$, of the polymer used to form the polymeric replica can vary widely. When the polymeric replica comprises an elastomer, the $T_g$ value can be, for example, about −150 to about 0° C., specifically about −100 to about −10° C., more specifically about −50 to about −25° C. When the polymeric replica comprises a thermoplastic, the $T_g$ value can be, for example, about 25 to about 450° C., specifically about 60 to about 400° C., more specifically about 90 to about 300° C., still more specifically about 100 to about 200° C.

The method can utilize polymeric replicas with a wide range of thicknesses. In some embodiments, the polymeric replica is separated from the crystalline master prior to coating the block copolymer film on the patterned surface of the polymeric replica that was previously in contact with the crystalline master. In these embodiments, the polymeric replica should be thick enough to be physically robust to separation of the polymeric replica from the crystalline master as well as coating and annealing of the block copolymer film on the polymeric replica. Depending on the properties of the material used to form the polymeric replica, thicknesses as small as several tens of nanometers can be sufficient in these embodiments, and there is no particular upper limit on the thickness of the polymeric replica (e.g., the thickness can be 1 centimeter or greater). In other embodiments, the polymeric replica is not separated from the crystalline master prior to coating the block copolymer film, and the block copolymer film is coated on the surface of the polymeric replica opposite the topographically patterned crystalline surface of the master. In these embodiments, the polymeric replica must be so thin that each of its two main surfaces is a replica of the topographically patterned crystalline surface of the master: the replica surface in contact with the topographically patterned crystalline surface of the master is an opposing (negative) copy of the topographically patterned crystalline surface, and the replica surface opposite the topographically patterned crystalline surface (and in contact with the block copolymer film) is a direct (positive) copy of the topographically patterned crystalline surface. In other words, the polymeric replica must be a conformal coating on the topographically patterned crystalline surface. In these embodiments, the polymeric replica can have a thickness of about 2 to about 30 nanometers, specifically about 3 to about 25 nanometers. Conformal coatings can be prepared by techniques including spin coating of a monomer composition followed by polymerization, and chemical vapor deposition of a monomer composition, followed by polymerization. If necessary for structural support during processing, a supporting layer can be applied to the surface of the block copolymer film opposite the polymeric replica.

Like the topographically patterned crystalline surface from which it is prepared, the topographically patterned surface of the polymeric replica can exhibit a variety of topologies. In some embodiments, the topographically patterned surface of the polymeric replica exhibits a sawtooth pattern characterized by a peak-to-peak separation of about 24 to about 200 nanometers and a peak-to-valley separation of about 3 to about 20 nanometers. In other embodiments, the topographically patterned surface of the polymeric replica exhibits a grooved pattern characterized by a groove depth of about 3 to about 20 nanometers and a groove-to-groove separation of about 24 to about 200 nanometers.

A block copolymer film is formed on the substrate surface comprising parallel facets. In order to form at least two domains in the block copolymer film, the block copolymer should comprise at least two chemically distinct blocks. The block copolymer can be, for example, a diblock copolymer, a triblock copolymer, a tetrablock copolymer, or a radial block copolymer. There is no particular limitation on the chemical composition of the block copolymer blocks, provided that block copolymer comprises a first block and second block that are sufficiently incompatible with each other to form separate phases. Incompatibility of the two blocks can be characterized by a difference in the Hildebrand solubility parameters of the two blocks. For example, when the block copolymer comprises a first block having a first Hildebrand solubility parameter and a second block having a second Hildebrand solubility parameter, the first Hildebrand solubility parameter and the second Hildebrand solubility parameter can differ by at least 0.4 megapascal$^{1/2}$.

In some embodiments, the block copolymer comprises at least one block selected from the group consisting of polyolefins, poly(alkenyl aromatic)s, poly(conjugated dienes)s, hydrogenated poly(conjugated dienes)s, poly(vinyl-substituted nitrogen heterocycle)s, poly(alkyl(meth)acrylate)s, poly((meth)acrylic acid)s, poly(alkylene oxide)s, poly (arylene oxide)s, poly(arylene sulfide)s, poly(vinyl alkanoates), poly(vinyl ether)s, poly(vinyl halide)s, poly(vinyl alcohol)s, polyurethanes, poly(meth)acrylonitriles, polyesters, polyamides, polyimides, polycarbonates, polysulfones, and polysiloxanes.

In some embodiments, the block copolymer comprises a poly(alkenyl aromatic) block that is the polymerization product of an alkenyl aromatic monomer having the structure

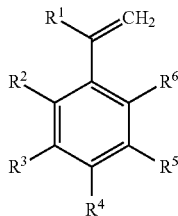

wherein $R^1$ is hydrogen or $C_1$-$C_6$ alkyl, and each occurrence of $R^2$, $R^3$, $R^4$, $R^5$, and $R^6$ is independently selected from the group consisting of hydrogen, $C_1$-$C_6$ alkyl, and halogen. In some embodiments, the block copolymer comprises a polystyrene block.

In some embodiments, the block copolymer comprises a poly(alkylene oxide) block, such as a poly(ethylene oxide) block, a poly(propylene oxide) block, or a poly(ethylene oxide-co-propylene oxide) block.

In some embodiments, the block copolymer comprises a poly(vinyl-substituted nitrogen heterocycle) block that is the polymerization product of a vinyl-substituted nitrogen heterocycle selected from the group consisting of 2-vinylpyridine, 3-vinylpyridine, 4-vinylpyridine, 2-methyl-5-vinylpyridine 1-vinylimidazole, 2-vinylimidazole, 4-vinylimidazole, N-vinyl-2-methylimidazole, N-vinyl-2-ethylimidazole, 2-vinylpyrrole, 3-vinylpyrrole, and mixtures thereof. In some embodiments, the block copolymer comprises a poly(4-vinylpyridine) block or a poly(2-vinylpyridine) block.

Specific block copolymers include, for example, polystyrene-b-poly(ethylene oxide), polystyrene-b-poly(2-vinylpyridine), polystyrene-b-poly(4-vinylpyridine), polystyrene-b-polybutadiene, polystyrene-b-polydimethylsiloxane, polystyrene-b-polylactide, and polystyrene-b-poly(methyl methacrylate). In some embodiments, the block copolymer comprises a polystyrene-b-poly(ethylene oxide).

In a specific embodiment, the block copolymer film comprises a polystyrene-b-poly(ethylene oxide) which in turn comprises a polystyrene block having a number average molecular weight of about 6,000 to about 30,000 atomic mass units and a poly(ethylene oxide) block having a number average molecular weight of about 2,000 to about 10,000 atomic mass units, wherein the ratio of the number average molecular weight of the polystyrene block to the number average molecular weight of the poly(ethylene oxide) block is about 2:1 to about 6:1.

The block copolymer can comprise the first block and the second block in a volume ratio of about 1:10 to about 10:1. In some embodiments, the block copolymer is asymmetric in that the molecular weight of the first block is substantially larger than the molecular weight of the second block. For example, the first block and the second block can differ in number average molecular weight by at least a factor of 1.5, specifically a factor of 1.5 to 6, more specifically a factor of 2 to 5, still more specifically a factor of 3 to 4.

In some embodiments, the block copolymer comprises about 65 to about 80 volume percent of a major block and about 20 to about 35 volume percent of a minor block.

In some embodiments, forming the block copolymer film comprises spin coating the block copolymer film from solution onto the substrate surface comprising parallel facets. For example, a solution of a polystyrene-b-poly(ethylene oxide) in benzene can be spin coated onto a substrate surface comprising parallel facets. The solvent is typically allowed to evaporate, leaving a block copolymer film free of components other than the block copolymer.

In some embodiments, the block copolymer film typically has a thickness of about 10 to about 100 nanometers. In some embodiments, the block copolymer film has a thickness corresponding to about one period of the block copolymer. The relationship between film thickness and the period of the block copolymer can be determined using methods known in the art. See, for example, T. P. Russell, P. Lambooy, J. G. Barker, P. D. Gallagher, S. K. Satija, G. J. Kellogg, and A. M. Mayes, *Macromolecules*, volume 28, page 787 (1995); and A. M. Mayes, S. K. Kumar, *MRS Bulletin*, volume 22, page 43 (1997). In some embodiments, the block copolymer film has a thickness of about $L_1$ to about $2L_1$, wherein $L_1$ is a center-to-center domain spacing of cylindrical microdomains in bulk block copolymer. FIG. 1 depicts $L_1$, as well as the related parameter $L_2$, for a hexagonal array of cylinders in a bulk block copolymer.

Once the block copolymer film is formed on the substrate surface comprising parallel facets, the block copolymer film is annealed to form an annealed block copolymer film comprising linear microdomains parallel to the substrate surface and orthogonal to the parallel facets. Annealing forms the linear microdomains and increases the long-range order (regularity) of the block copolymer microdomains. In some embodiments, the linear microdomains have a periodicity (center-to-center separation) of about 15 to about 60 nanometers, specifically about 20 to about 50 nanometers, more specifically about 25 to about 40 nanometers.

An important advantage of the present method is that the linear microdomains produced exhibit a high degree of long-range order. For example, the annealed block copolymer film can have an order parameter, f, of at least 0.95 over an area of at least 0.5 millimeter$^2$. Calculation of the order parameter, f, is described in the Experimental Details section below. In some embodiments, the annealed block copolymer film has an order parameter, f, over an area of at least 0.5 millimeter$^2$ that is greater than the corresponding order parameter for the substrate surface. In other words, the annealed block copolymer film can exhibit greater long-range order than the crystalline substrates used in its formation.

In some embodiments, annealing the block copolymer film comprises thermal annealing. Annealing conditions can be selected based on the thermal properties of the block copolymer. For example, thermal annealing can be conducted for a period of 10 minutes to 24 hours at a temperature that is about 40 to about 60° C. above the glass transition temperature of the major phase of the block copolymer. Specific annealing conditions will depend on factors including the chemical identities of the block copolymer major and minor blocks, the molecular weight of the block copolymer, and the interactions of the block copolymer with the substrate. As an illustration, when the block copolymer is a polystyrene-b-poly(ethylene oxide), thermal annealing can comprise maintaining the block copolymer film at a temperature of about 130 to about 180° C., specifically about 145 to about 165° C., for about 0.5 to about 5 hours, specifically about 1 to about 3 hours.

In some embodiments, annealing the block copolymer film comprises solvent vapor annealing. When the block copolymer comprises a major block and a minor block, solvent vapor annealing can comprise exposing the block copolymer film to a vapor of a solvent in which the minor block is more soluble than the major block. For example, when the block copolymer comprises a polystyrene-b-poly(ethylene oxide), solvent vapor annealing can comprise exposing the block copolymer film to a solvent vapor comprising water and tetrahydrofuran. In some embodiments in which the block copolymer comprises a polystyrene-b-poly(ethylene oxide), solvent vapor annealing comprises exposing the block copolymer film to a first solvent vapor comprising water, then exposing the block copolymer film to a second solvent vapor comprising water and tetrahydrofuran.

In some embodiments, solvent vapor annealing comprises exposing the block copolymer film to a solvent vapor for about 1 to about 4 hours at a temperature of about 15 to about 30° C. Within the time range of about 1 to about 4 hours, the solvent vapor annealing time can be about 1.5 to about 3 hours, specifically about 1.5 to about 2 hours.

A combination of thermal annealing and solvent vapor annealing can be used to anneal the block copolymer film.

As described below, the present inventors have determined that there are two regimes that promote the formation of an annealed block copolymer film comprising linear microdomains parallel to the substrate surface and orthogonal to the parallel facets. The regimes correspond to a ratio $\lambda/L_2$ that is either less than or equal to 0.73 or greater than or equal to 1.4. In this ratio, $\lambda$ is the pitch of the parallel facets on the substrate, and $L_2$ is the center-to-center spacing of adjacent cylindrical microdomains in a hexagonal array of cylindrical microdomains in the block copolymer in bulk.

When $\lambda/L_2$ is less than or equal to 0.73, it can be, for example about 0.2 to 0.73, specifically about 0.3 to about 0.7.

When $\lambda/L_2$ is greater than or equal to 1.4, it can be, for example, 1.4 to about 6, specifically about 2 to about 5.

Different $\lambda$ values can be selected by varying the crystalline substrate type, the substrate miscut angle, and the substrate annealing temperature. In some embodiments, the $\lambda$ value is about 40 to about 160 nanometers, specifically about 60 to about 120 nanometers. The value of $\lambda$ can be determined, for example, by atomic force microscopy or X-ray scattering. When the faceted substrate comprises variations in the pitch of the facets, the value of $\lambda$ can be determined by taking an average of observed pitches (e.g., an average of about 20 to 30 pitches).

Different $L_2$ values can be obtained by varying block copolymer molecular weight, with higher molecular weights corresponding to larger $L_2$ values. In some embodiments, the $L_2$ value is about 7 to about 80 nanometers, specifically about 15 to about 60 nanometers. In the experiments described below, the annealing step proceeded via an intermediate block copolymer film structure comprising a hexagonal array of cylindrical microdomains orthogonal to the plane of the film. Thus, in some embodiments, annealing the block copolymer film comprises annealing the block copolymer film to form a first (intermediate) annealed block copolymer film comprising a hexagonal array of cylindrical microdomains having a major axis normal to film, and further annealing the first annealed block copolymer film to form the annealed block copolymer film comprising linear microdomains parallel to the substrate surface and orthogonal to the parallel facets. It is important to note, however, that even when the block copolymer forms a hexagonal array of cylinder in bulk, annealing to form the linear microdomains does not necessarily proceed via an intermediate block copolymer film with a hexagonal array of cylindrical microdomains.

In a very specific embodiment of the method, the block copolymer film has a thickness of about $L_1$ to about $2L_1$, wherein $L_1$ is a center-to-center domain spacing of cylindrical microdomains in bulk block copolymer; the block copolymer film comprises a polystyrene-b-poly(ethylene oxide); the polystyrene-b-poly(ethylene oxide) comprises about 65 to about 80 volume percent of a polystyrene block and about 20 to about 35 volume percent of a poly(ethylene oxide) block; the substrate comprises crystalline aluminum oxide or a poly(butylene terephthalate) replica of a crystalline aluminum oxide surface; solvent vapor annealing comprises exposing the block copolymer film to a solvent vapor comprising water and tetrahydrofuran for about 1 to about 4 hours at a temperature of about 15 to about 30° C.; and the annealed block copolymer film has an order parameter, f, of at least 0.95 over an area of at least 0.5 millimeter.

The invention includes articles formed by the above-described methods. For example, one embodiment is a structured article prepared by any of the above-described methods and comprising: a substrate comprising a surface comprising parallel facets characterized by a pitch, $\lambda$, corresponding to the separation between adjacent facets; and a block copolymer film comprising a surface contacting the substrate surface comprising parallel facets; wherein the block copolymer in bulk comprises a hexagonal array of cylindrical microdomains characterized by a center-to-center spacing, $L_2$, of adjacent cylindrical microdomains; wherein $\lambda/L_2$ is either less than or equal to 0.73 or greater than or equal to 1.4.

One embodiment is a structured article, comprising: a substrate comprising a surface comprising parallel facets characterized by a pitch, $\lambda$, corresponding to the separation between adjacent facets; and a block copolymer film comprising a surface contacting the substrate surface comprising parallel facets; wherein the block copolymer in bulk comprises a hexagonal array of cylindrical microdomains characterized by a center-to-center spacing, $L_2$, of adjacent cylindrical microdomains; wherein $\lambda/L_2$ is either less than or equal to 0.73 or greater than or equal to 1.4.

Once the annealed block copolymer film comprising linear microdomains has been formed, it can, optionally, be subjected to further processing steps to yield useful structures. For example, the annealed block copolymer film can be subjected to surface reconstruction. The surface reconstruction method is described in T. Xu, C. J. Hawker, and T. P. Russell, *Advanced Functional Materials*, volume 13, page 698 (2003) and typically consists of exposing the annealed block copolymer film to a solvent that preferentially dissolves the minor phase of the block copolymer film and effects transfer of that phase to the surface of the film opposite the substrate. It is important to note that no chemical bonds are broken in the surface reconstruction process, and that the process is reversible (for example, by the application of heat). Surface reconstruction is conducted at a temperature below the glass transition temperature of the major (matrix) phase of the block copolymer film, so that the structure of the film is conserved in that the spaces formerly occupied by the minor phase are converted to voids. For example, when the minor phase consists of lines parallel to the plane of the film, surface reconstruction results in the migration of the minor phase to the top surface of the film and formation of linear voids (troughs or trenches) where the minor phase formerly resided.

The method can, optionally, further comprise coating an etch-resistant material onto the surface-reconstructed block copolymer film to form a resist-coated block copolymer film. Techniques for coating an etch-resistant material are known in the art and described, for example, in U.S. Patent Application Publication No. US 2010/0112308 A1 of Russell et al. The etch-resistant layer can be coated using various methods known in the art, including, for example, evaporating, sputtering, chemical vapor deposition (CVD), and metalorganic chemical vapor deposition (MOCVD). The etch-resistant layer will generally include at least one material that is more etch-resistant than the block copolymer film. Suitable materials include metals, such as iron, ruthenium, osmium, cobalt, nickel, palladium, platinum, copper, silver, gold, and the like, and alloys of the foregoing. When the etch-resistant layer comprises a metal, the etch-resistant layer can be formed by evaporating the metal and allowing the evaporated metal to deposit on the top surface of the block copolymer film. In some embodiments, including those embodiments in which subsequent etching of the substrate is intended, it is desirable to avoid depositing etch-resistant material into the voids formed on surface reconstruction. In these embodiments, the etch-resistant material is deposited from a glancing angle relative to the plane of the block copolymer film. In other embodiments, it is desirable to deposit etch-resistant material into the voids formed on surface reconstruction so that the etch-resistant material is deposited through the voids onto the substrate. In these embodiments, the etch-resistant material is deposited from an angle approximately normal to the plane of the block copolymer film. Although the term "etch-resistant layer" is used, coating the etch-resistant material need not be followed by an etching step.

The resist-coated block copolymer film can, optionally, be further processed via etching to form voids in the substrate corresponding to the linear voids of the surface-reconstructed block copolymer film. Suitable etching methods include for example, dry chemical etching, wet chemical etching, plasma etching, reactive ion etching, micromachining, electron beam writing, laser micromachining, ablation, ion beam milling, and the like. In some embodiments, reactive ion etching is used. Suitable precursors for reactive ion etching include, for example, tetrafluoromethane, fluorotrichloromethane, and antimony hexafluoride. In some embodiments, etching the resist-coated block copolymer film comprises reactive ion etching using a tetrafluoromethane precursor. The resulting nanopatterned substrate (whether a crystalline substrate or a polymeric replica) can be separated from the etch-resistant layer and the block copolymer film. This separation step can, for example, comprise contacting the etched article with a solution capable of dissolving or solubilizing the etch-resistant layer. For example, when the etch-resistant layer comprises gold, suitable solutions include aqueous solutions comprising potassium iodide and iodine, and aqueous solutions comprising cyanide ion. In some embodiments, the separation step comprises using a so-called lift-off method to swell the block copolymer layer and separate it and the overlying etch-resistant layer from the etched substrate. Solvents suitable for use in a lift-off method include any solvent or solvent mixture capable of swelling the block copolymer but not irreversibly harming the substrate (particularly when the substrate is a polymeric replica). For example, when the block copolymer is a polystyrene-b-poly(4-vinylpyridine), suitable solvents include toluene, tetrahydrofuran, chloroform, dimethylformamide, dimethylacetamide, and the like, and mixtures thereof. The lift-off method can, optionally, comprise agitation or sonication to facilitate separation of the swollen block copolymer layer from the substrate. In some embodiments, separating the etch-resistant layer and the block copolymer film from the nanopatterned substrate comprises contacting the etched article with an aqueous solution comprising potassium iodide and iodine.

The invention is further illustrated by the following non-limiting examples.

Figure 2:
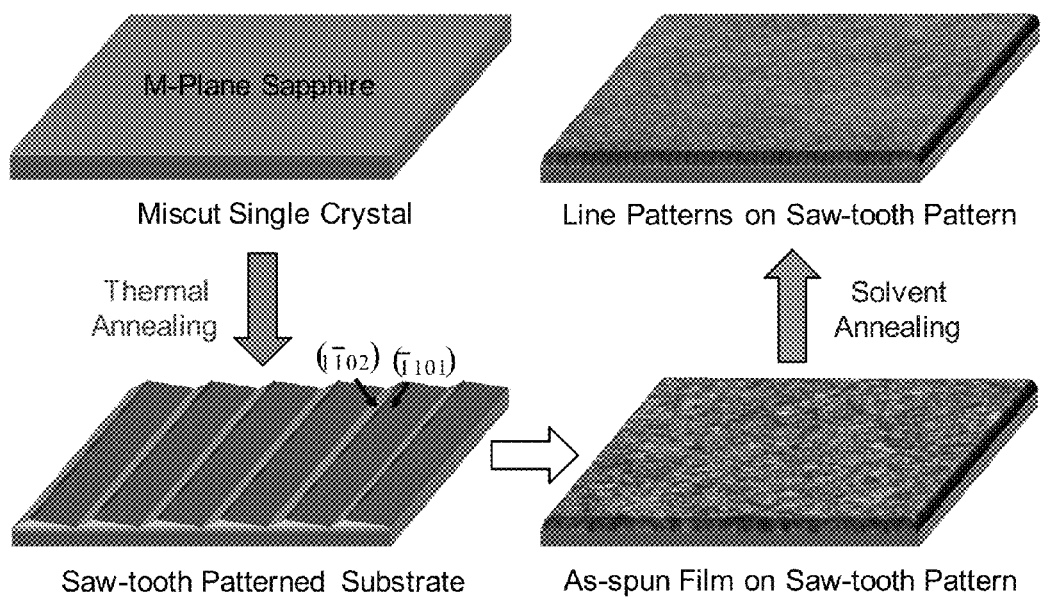
FIG. 2 depicts one embodiment of a process for preparation of a highly aligned and oriented block copolymer line pattern on a faceted sapphire substrate; an M-plane surface of miscut single crystal sapphire is thermally annealed to yield a faceted surface (e.g., a sawtooth-patterned substrate); a polystyrene-b-poly(ethylene oxide) is spin coated onto the substrate and solvent-annealed with vapor of a tetrahydrofuran/water mixture to form a block copolymer film with lines parallel to the sapphire substrate and orthogonal to the facets of the sapphire substrate.

FIG. 2 depicts one embodiment of a process to produce line patterns in thin films of polystyrene-b-poly(ethylene oxide) (PS-b-PEO) on a faceted sapphire substrate. The facets are produced by thermally annealing a single crystal surface of sapphire, cut along the M-plane (a crystallographic plane that is unstable at elevated temperatures), at 1500° C. for 24 hours in air. See, e.g., M. Huth, K. A. Ritley, J. Oster, H. Dosch, H. Adrian, *Advanced Functional Materials*, volume 12, page 333 (2002); and R. Gabai, A. Ismach, E. Joselevich, *Advanced Materials*, volume 19, page 1325 (2007). The surface reconstructs to form stable crystal facets that result in a sawtooth topography over the entire surface, where the orientation of the facets is in register with the underlying single crystal. Other materials, like silicon, can also be used, though the annealing conditions will be different. A thin film of cylinder-forming PS-b-PEO (having a number average molecular weight of 26.5 kilograms/mole) that, in the bulk, orders into hexagonal arrays with a center-to-center distance between adjacent cylindrical microdomains of $L_2=L_1\times(2/\sqrt{3})$ =37.5 nanometers in bulk (a center-to-center domain spacing of cylindrical domains of $L_1=2\pi/q^*=32.5$ nanometers in bulk) was prepared on the faceted sapphire substrate and then exposed to tetrahydrofuran (THF), a good solvent for both blocks, and water, a good solvent for only the PEO block, to produce a well-developed nanostructure.

Figure 3:
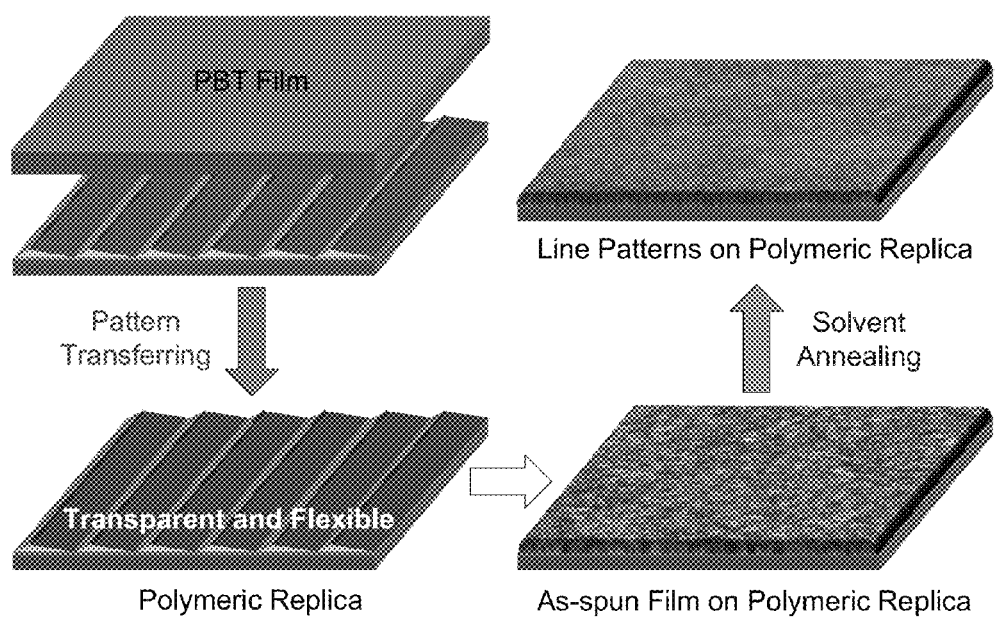
FIG. 3 depicts one embodiment of a process for preparation of a highly aligned and oriented block copolymer line pattern on a polymeric replica of a faceted crystalline substrate; the surface of the faceted crystalline substrate is replicated on a surface of a poly(butylene terephthalate) (PBT) film; a polystyrene-b-poly(ethylene oxide) copolymer is spin coated onto the polymeric replica and solvent-annealed with vapor of a tetrahydrofuran/water mixture to form a block copolymer film with lines parallel to the polymeric substrate and orthogonal to the facets of the polymeric substrate.

FIG. 3 depicts a process similar to that in FIG. 2, except that the block copolymer film is formed on a polymeric replica of the faceted sapphire substrate.

Figure 4:
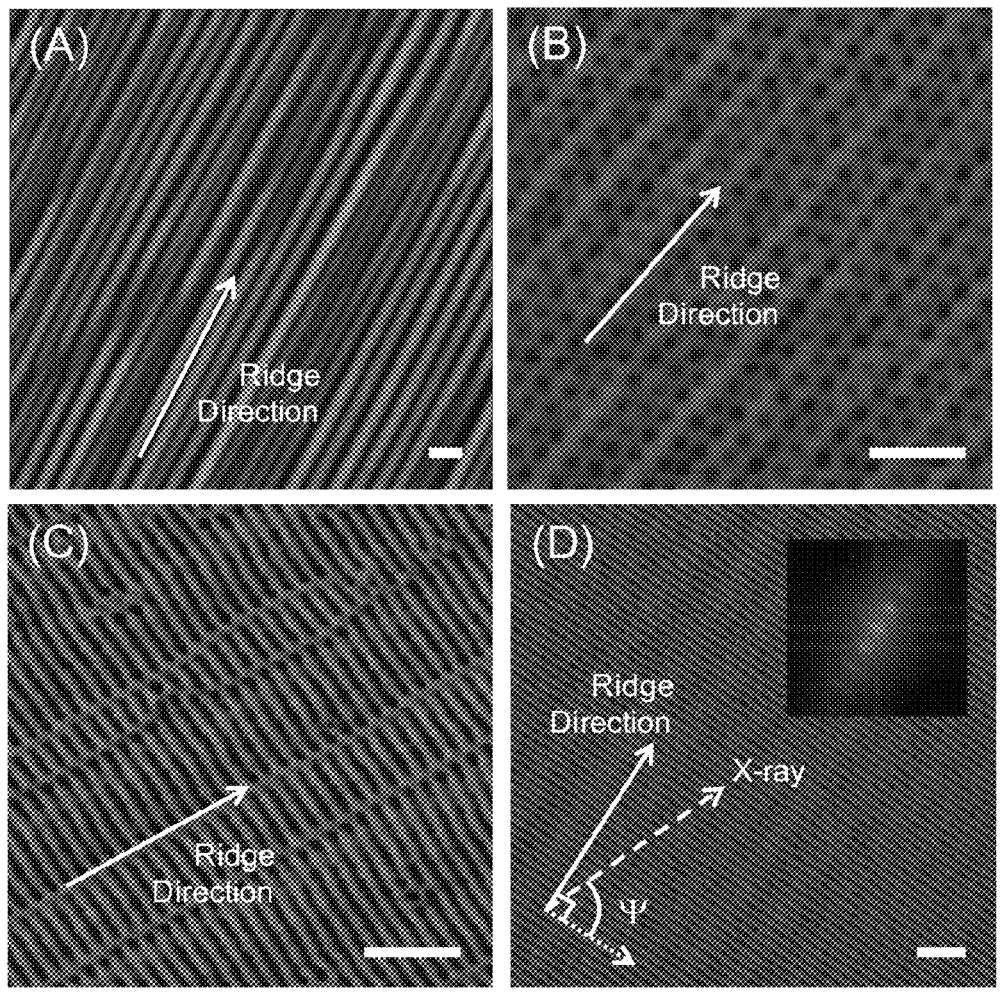
FIG. 4 (A) Scanning Force Microscopy (SFM) height image of faceted sapphire substrate; (B) SFM phase image of a 38.0 nanometer thick polystyrene-b-poly(ethylene oxide) copolymer (number average molecular weight=26.5 kilograms/mole) thin film on a faceted sapphire substrate; (C) the block copolymer film of (B) after solvent vapor annealing for 0.5 hours; (D) SFM phase image of a 47.6 nanometer thick polystyrene-b-poly(ethylene oxide) copolymer (number average molecular weight=26.5 kilograms/mole) thin film on a faceted sapphire substrate after solvent vapor annealing for 2 hours; the inset in (D) is the Fourier transform of the SFM image; the scale bars in all images are 200 nanometers.
Figure 5:
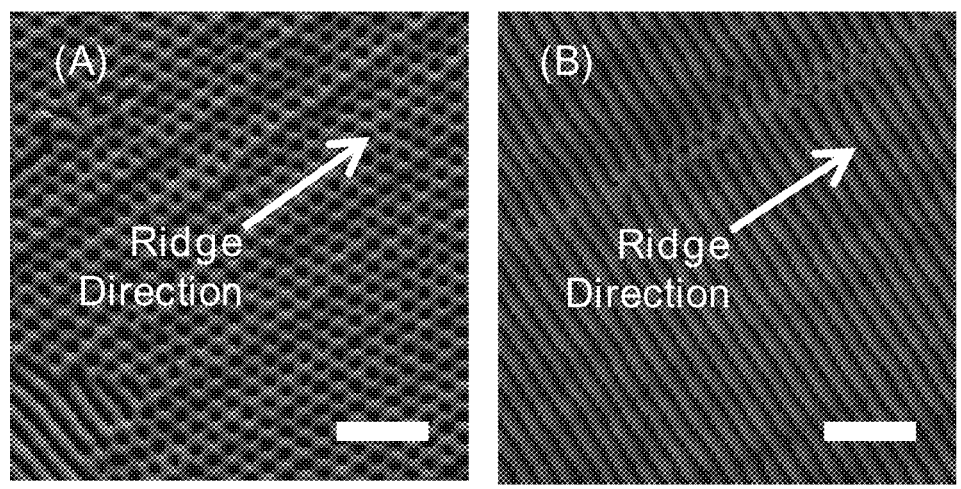
FIG. 5 (A) SFM phase images of a 38.0 nanometer thick polystyrene-b-poly(ethylene oxide) copolymer (number average molecular weight=26.5 kilograms/mole) thin film on a faceted sapphire substrate after annealing for 1.0 hour; (B) SFM phase images of a 47.6 nanometer thick polystyrene-b-poly(ethylene oxide) copolymer (number average molecular weight=26.5 kilograms/mole) thin film on a faceted sapphire substrate after annealing for 1.5 hours; scale bars on both images are 200 nanometers.
Figure 6:
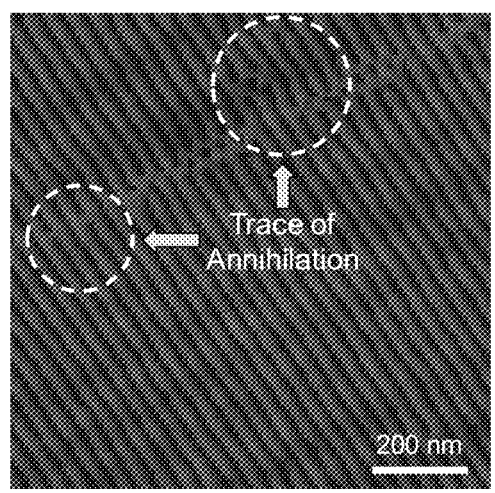
FIG. 6 is the image of FIG. 5(B) annotated to highlight the annihilation of defects between the microdomains.

FIG. 4 shows scanning force microscopy (SFM) images of solvent-annealed PS-b-PEO thin films under different annealing conditions. FIG. 4(A) is an image of the annealed sapphire surface. When a PS-b-PEO thin film with a thickness of 38.0 nanometers (as measured on a flat substrate) is solvent-annealed for 1 hour, hexagonally packed PEO microdomains, oriented normal to the film surface and having long-range lateral order, are produced, as shown in FIG. 4(B). These results are identical to those of Park et al., *Science*, volume 323, page 1030 (2009). However, the Park article gave no indication that further annealing would produce a different highly-ordered structure. As the annealing time is increased, the PEO microdomains are seen to fuse, producing cylindrical microdomains oriented parallel to the film surface (see FIG. 5(A)). With further solvent annealing, the PEO microdomains transform into cylindrical microdomains oriented parallel to the film surface but orthogonal to the facet ridges. The cylindrical microdomains are truncated at the crests of the facets (FIGS. 4(C) and 5(A)), since the amplitudes of the facets are comparable to the initial film thickness. By increasing the thickness of the film to 47.5 nanometers (as measured on a flat substrate), the initial solvent annealing produced cylindrical microdomains oriented normal to the surface and, with further solvent annealing, a similar fusion of the microdomains occurred but, now, the microdomains span across the facets (see FIGS. 5(B) and 6). Ultimately, highly aligned PEO cylindrical microdomains oriented parallel to the surface and orthogonal to the facets were obtained, as shown in FIG. 4(D). Since the thickness of the film in FIG. 4(D) is less than $2L_1$, a monolayer of cylindrical microdomains was produced. The Fourier transform of FIG. 4(D)

(in inset) shows multiple higher-order interferences, characteristic of the long-range lateral ordering of the cylindrical microdomains. Micrographs identical to that in FIG. 4(D) were obtained over the entire surface showing that the orientation was preserved.

Figure 7:
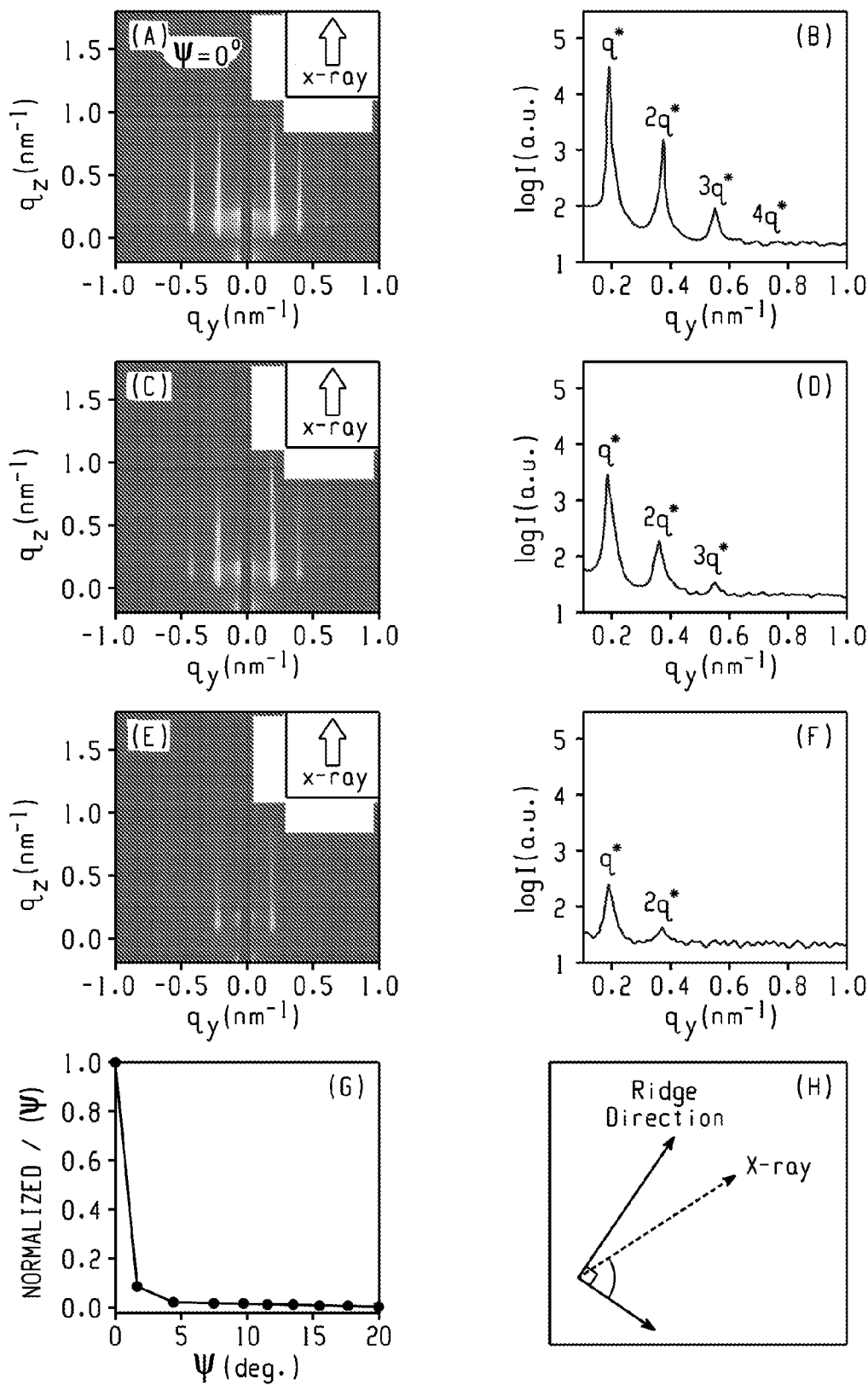
FIG. 7 shows Grazing Incidence Small Angle X-ray Scattering (GI-SAXS) patterns of polystyrene-b-poly(ethylene oxide) copolymer thin films on a faceted sapphire substrate; (A) the X-ray beam follows the (10) lattice line; from this point, the sample stage is rotated to (C) 2° and (E) 4°; the line profiles of scattering as a function of the scattering vector in (B), (D), and (F) correspond to (A), (C), and (E), respectively; $q_y$ is the in-plane scattering vector; (G) plot of the integrated intensities of the first order reflection as a function of rotation angle; these data were used to calculate the orientation function with respect to the normal of the ridge direction; (H) the schematic representation for defining rotation angle.
Figure 8:
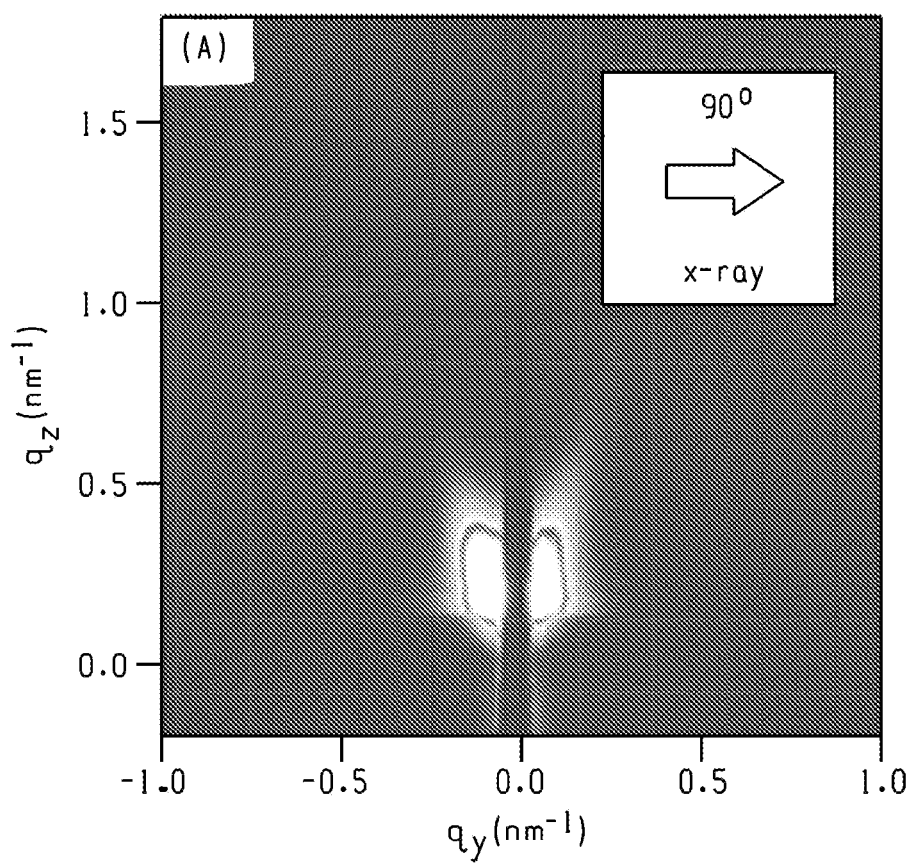
FIG. 8 (A) GI-SAXS pattern of a polystyrene-b-poly(ethylene oxide) copolymer thin film on a faceted sapphire substrate, where the X-ray beam is in the direction of the ridges of the facets; (B) the line profile of scattering as a function of the scattering vector shown in (A), where $q_y$ is the in-plane scattering vector.
Figure 8:
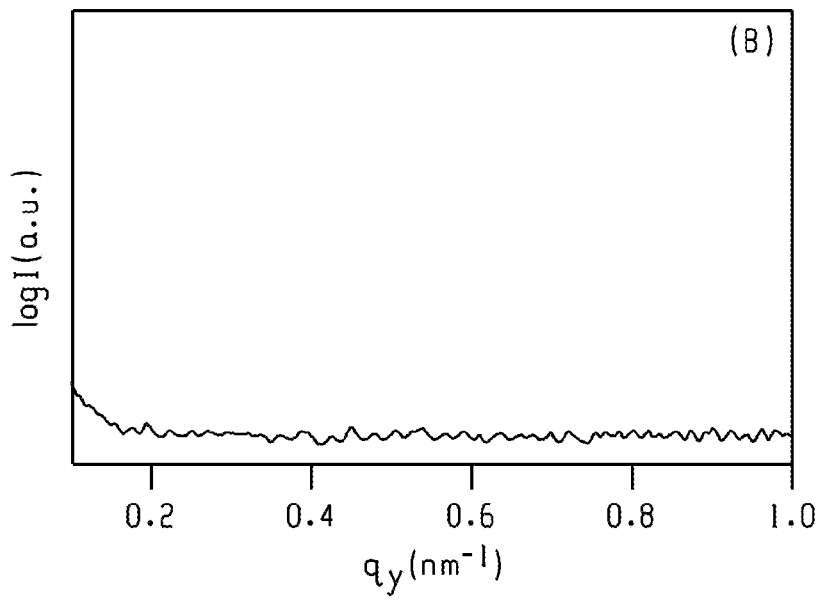
Figure 9:
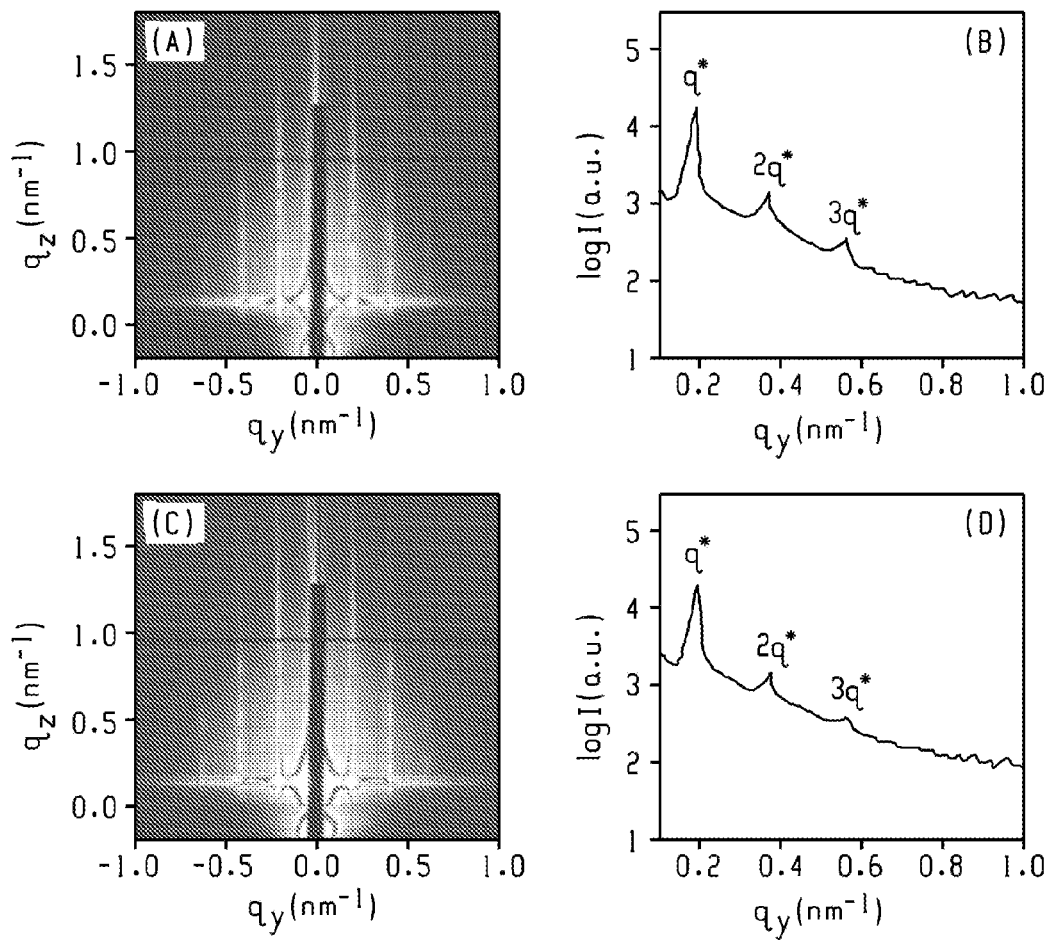
FIG. 9 GI-SAXS patterns of polystyrene-b-poly(ethylene oxide) copolymer thin film on smooth silicon wafer: (A) and (C) are in orthogonal directions; the line scans of the (A) and (C) profiles are in (B) and (D), respectively; $q_y$ is in-plane scattering vector.
Figure 10:
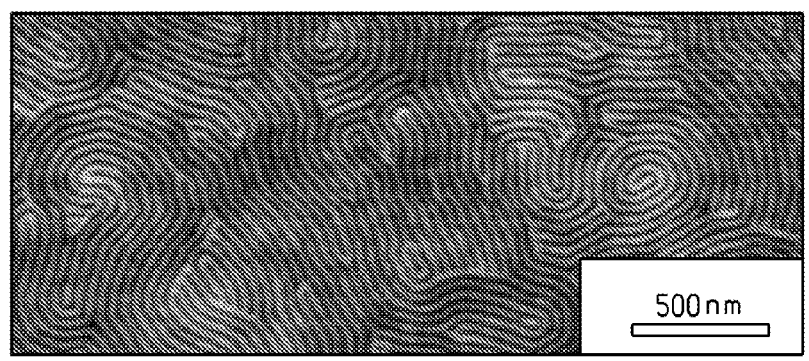
FIG. 10 is an SFM height image of a polystyrene-b-poly(ethylene oxide) copolymer (number average molecular weight=26.5 kilograms/mole) thin film with a thickness of 47.6 nanometers on a flat silicon wafer substrate; the film was solvent-annealed with tetrahydrofuran and water.

Since SFM characterizes only the local ordering of the BCP microdomains, typically over areas less than 20 micrometers by 20 micrometers, grazing incidence small angle X-ray scattering (GI-SAXS) was used to characterize the lateral ordering and orientation of the microdomains on the nanoscopic level over macroscopic distances. See, e.g., G. E. Stein, E. J. Kramer, X. Li, J. Wang, *Physical Review Letters*, volume 98, page 086101 (2007). FIG. 7 shows the GI-SAXS patterns of a PS-b-PEO thin film corresponding to the sample in FIG. 4(B). The incident angle was fixed at 0.18°, which is above the critical angle of the BCP but below the critical angle of sapphire, so that the X-ray beam penetrates into the polymer film and is totally reflected at the sapphire interface. At this incidence angle, the projection of the X-ray beam on the surface is more than 0.100 centimeter by 1.00 centimeter. The counting time in each case was fixed at 1 second. When the sample was aligned so that the direction of the X-ray beam coincided with the direction of the cylindrical microdomains, Bragg rods are observed at scattering vectors corresponding to nL, where n is an integer and L is a center-to-center distance between adjacent cylindrical microdomains in thin film, as shown in FIG. 7(A). No scattering from the facets was observed, since the ridges are orthogonal to the direction of the X-ray beam and the beam stop occluded the specularly reflected beam (see FIG. 8 for the GI-SAXS pattern when the ridges of the facets are parallel to the direction of the X-ray beam). The position of the first order reflection corresponds to a spacing of 34.9 nanometers, which corresponds closely to $L_1$ of the hexagonally packed cylindrical microdomains in bulk. As the sample is rotated from the direction where the X-ray beam coincides with the (1 0) plane by 2° (FIG. 7(C)), the reflections broaden and the intensities decrease by an order of magnitude. By rotating the sample a further 2°, the intensities decrease by more than two orders of magnitude. FIG. 7(B) shows the one-dimensional profile of FIG. 7(A) along $q_y$ (in the plane of the film) where multiple orders of scattering are seen from this monolayer of highly aligned cylindrical microdomains oriented parallel to the substrate. From the dependence of the scattering as a function of the rotation angle of the sample with respect to the plane of incidence of the X-ray beam (FIG. 7(G)), an orientation parameter, f, can be calculated (see Experimental Details section, below) where, for perfect orientation of the microdomains, f=1.0 and, for random orientation, f=0. Here, f is found to be 0.947, which is characteristic of a film comprised of essentially perfectly ordered and oriented cylindrical microdomains with no grains or misorientations over large areas. Contrasting these results are those obtained for a thin film of PS-b-PEO ($M_n$=26.5 Kg/mol) prepared on a smooth silicon wafer and subjected to the identical solvent annealing conditions (see FIG. 9). The GI-SAXS patterns from these films show Bragg rods centered at $q_y$=0.186 nm$^{-1}$, corresponding to a center-to-center distance between adjacent cylindrical microdomains of 33.8 nm. This is essentially the same as that found with the faceted surfaces. However, there is no dependence of the GI-SAXS patterns on the angle of rotation. A line scan of the data shows up to three orders of scattering, indicating that the cylindrical microdomains are well-ordered locally. The GI-SAXS results are consistent with the SFM image which shows the classic fingerprint pattern of the cylindrical microdomains oriented parallel to the surface with only a local ordering but no long-range lateral ordering (see FIG. 10).

The orientation of BCP lamellar microdomains normal to film surface on a substrate lithographically patterned with trenches, where the interfacial interactions were balanced, has been studied previously. See H.-C. Kim, C. T. Rettner, L. Sundström, *Nanotechnology*, volume 19, page 235301 (2008). In that study, the lamellar microdomains were found to orient normal to the trench walls. Frustration effects near the boundary of the trenches, where the corrugation would impose high stress on chains oriented parallel to the trench direction, were argued to be responsible for the lamellar orientation. In the present methods utilizing a cylinder-forming BCP on the faceted substrate, where the minor component interacts preferentially with the substrate, the origin of the orientation of the microdomains is fundamentally different. The free energies of cylindrical microdomains oriented normal ($F_+$) and parallel to the facets ($F_\parallel$) were determined in the strong segregation limit. The free energy per chain of a strongly segregated BCP is the sum of four terms: $F=F_A+F_B+F_{AB}+F_S$, where the first two terms are the stretching energies of A and B block and the last two terms represent the A/B interfacial energy and surface/polymer interfacial energy, respectively. With a faceted surface having a pitch, λ, with two facet angles ($\theta_1$=17.6°, $\theta_2$=32.4°), the stretching energies per chain can be computed by $$F_A = \sqrt{3}\pi F_b (1+\sqrt{f})^2 \int_{V_A} dr z^2/(4f^2 V L_1^2) \text{ and } F_B = \sqrt{3}\pi F_b (1+\sqrt{f})^2 \int_{V_B} dr z^2/(4(1-f)^2 V L_1^2)$$

where $F_b$ is the bulk free energy of cylindrical morphology, f is the volume fraction of minority block (A block), V is the volume of the film, $\int_{V_\alpha} dr$ indicates an integral over the volume of α-domain (α=A or B), and z is the shortest distance from the A/B interface. The interfacial energies per chain have the form of $F_{AB}=[2\sqrt{3}/(27\pi f)]^{1/2} F_b L_1 S_{AB}/V$ and $F_S=[2\sqrt{3}/(27\pi f)]^{1/2} F_b L_1 2(h_{AS} S_{AS} + h_{AV} S_{AV}) + \Delta h_S S_{BS} + \Delta h_V S_{BV}]/V$ where $S_{\alpha\beta}$ is the α/β interfacial area (the subscripts S and V indicate substrate and vapor, respectively), $h_{\alpha\beta}=\gamma_{\alpha\beta}/\gamma_{AB}$ and $\Delta h_\alpha=(\gamma_{B\alpha}-\gamma_{A\alpha})/\gamma_{AB}$ with α/β interfacial tension $\gamma_{\alpha\beta}$. Here, we consider the case $\Delta h_S$>0 and $\Delta h_V$=0, i.e., the substrate preferentially interacts with the minority A block ($\Delta h_S$=0.1) whereas the solvent vapor at the film surface is energetically neutral for both blocks.

Figure 11:
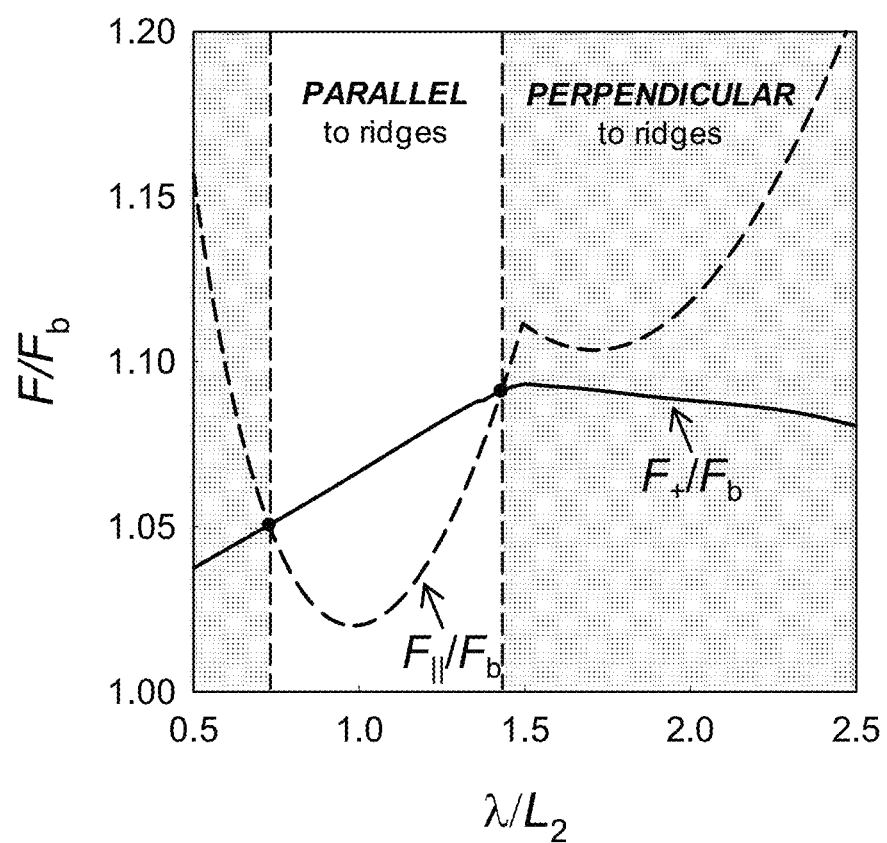
FIG. 11 is a plot of the free energies per chain of cylinders parallel to the facets (solid line: $F_\parallel$) and orthogonal to the facets (dotted line: $F_\perp$) as a function of pitch for the BCP films with a 0.25 volume fraction of the minor phase, $\Delta/L_1=1.1$, $\theta_1=17.6°$, $\theta_2=32.4°$, $h_{AS}=0.0$, $\Delta h_S=0.1$, $h_{AV}=0.0$, $\Delta h_V=0.0$; the free energy and the pitch are normalized by bulk free energy and $L_2$ at bulk, respectively; the black filled circles represent the transition point between two different cylinder orientations.

FIG. 11 shows the free energies per chain of BCP film (in unit of bulk free energy) on the faceted substrate selective for the major block as a function of pitch (in units of $L_2$) when the thickness, Δ, from the valley to the top of the film, is $1.1L_1$. When $\lambda/L_2$<1.5 and h/Δ is small (<0.37), orienting the cylindrical microdomain parallel to the ridges is favored. $F_\parallel$ is a minimum when $\lambda/L_2$=1.0. When $\lambda/L_2$>1.5, $F_\parallel$ shows another minimum at $\lambda/L_2$≅1.7. The non-integer value arises from an elastic penalty due to diagonal compression of the microdomain lattice. $F_+$ is nearly independent of $\lambda/L_2$, since the cylindrical microdomains can relieve the packing frustration by orienting cylinders across the valley of facet where the film thickness is maximum Two regimes were found where the orientation of the cylindrical microdomains normal to the ridges was favored, i.e., where $F_+$<$F_\parallel$. When $\lambda/L_2$ is small ($\lambda/L_2$<0.73), incommensurability between λ with $L_2$ forces the microdomain to orient normal to the ridges and for $\lambda/L_2$>1.4, applicable to the experiments herein, commensurability effects and a vertical compression cause the orthogonal orientation to be more favored. It should be noted that, since there is a distribution of pitches on the faceted surface and $\lambda/L_2$>1.4 for all the pitches, these theoretical results explain the insensitivity of the microdomain orientation to the pitch (FIG. 4(A)). It should be also pointed out that, if a solvent is used that is selective for the major component block, then an orientation of the microdomains normal to the surface becomes more favorable, as seen in our previous study. S. Park, D. H. Lee, J. Xu, B. Kim, S. W. Hong, U. Jeong, T. Xu, T. P. Russell, *Science*, volume 323, page 1030 (2009).

Figure 12:
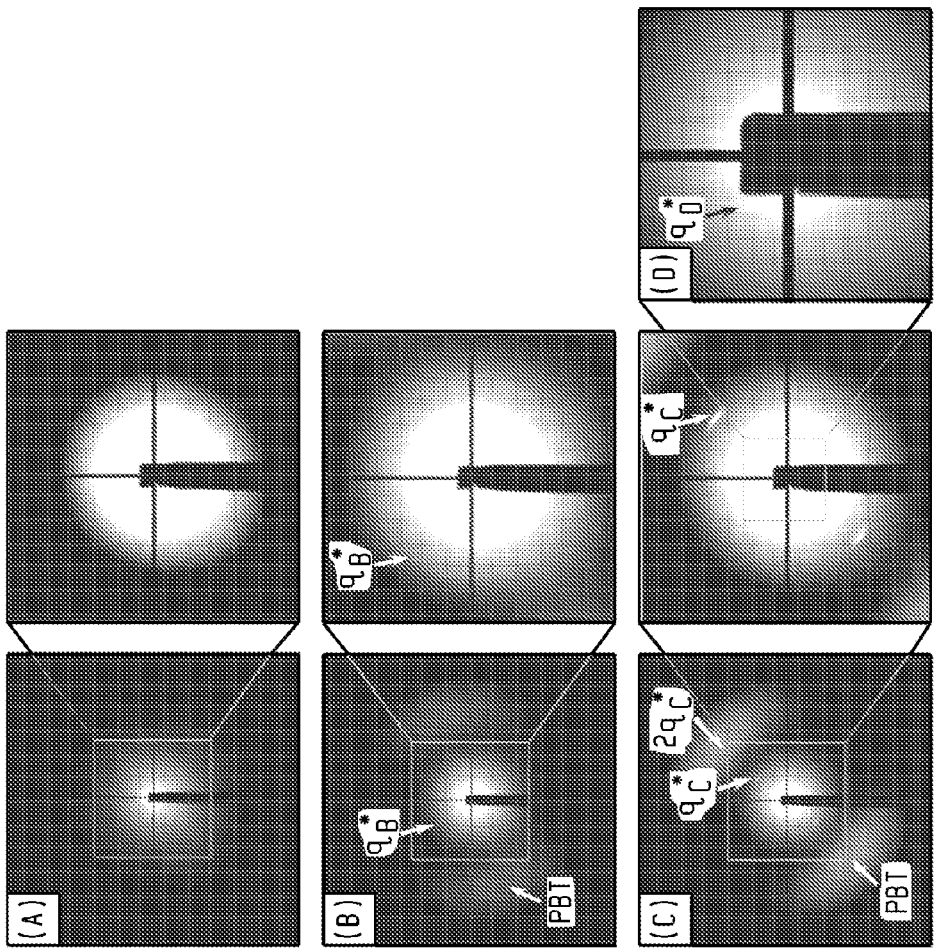
FIG. 12 shows 2D Transmission SAXS results for polystyrene-b-poly(ethylene oxide) copolymer thin films on (B) a flat poly(butylene terephthalate) film ($q_B^*=0.186$ nm$^{-1}$); and (C) a faceted poly(butylene terephthalate) film ($q_C^*=0.185$ nm$^{-1}$); (A) the background without BCP film and PBT film; and (D) the magnified area near the beamstop in (C).
Figure 13:
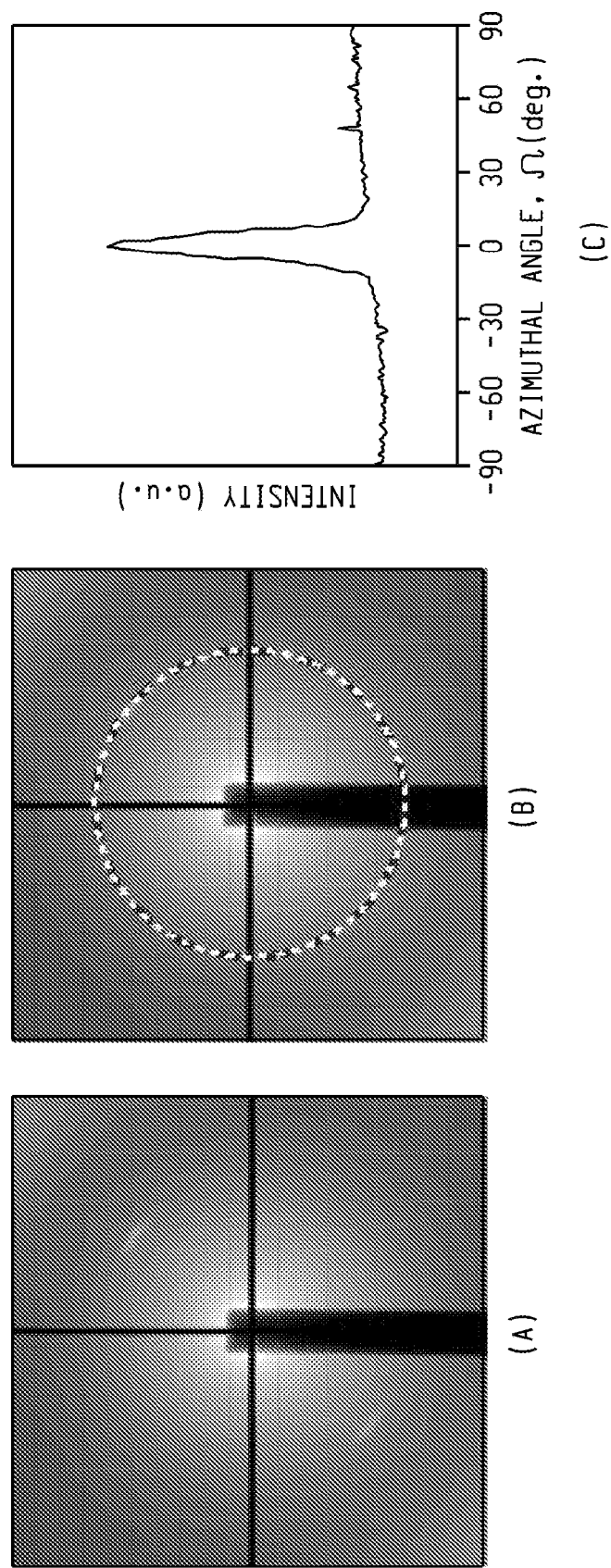
FIG. 13 (A) 2D Transmission SAXS results for polystyrene-b-poly(ethylene oxide) copolymer thin films on a faceted poly(butylene terephthalate) film; (B) same image as (A) with a superimposed circle showing the path used for plotting intensity versus azimuthal angle, where the azimuthal angle is defined as zero degrees at the point of maximum intensity; (C) a plot of the integrated intensities of the first order reflection as a function of azimuthal angle.

Developing a simple way to generate highly aligned cylindrical microdomains on substrates that are flexible, less expensive, and easier to prepare than reconstructed sapphire or silicon is highly desirable for applications ranging from flexible displays to roll-to-roll processes. See, e.g., M. Huth, K. A. Ritley, J. Oster, H. Dosch, H. Adrian, *Advanced Functional Materials*, volume 12, page 333 (2002). Poly(butylene terephthalate) (PBT), a thermoplastic polymer having excellent mechanical properties, resistance to organic solvents, and relatively high melting point, was used for this purpose. As depicted in FIG. 3, PBT was used to replicate the faceted sapphire surface by heating the PBT to 200° C., slightly below the melting point but well above the glass transition temperature of PBT, and imprinting the topography of the sapphire surface onto the surface of the PBT. After releasing the PBT, the surface features of the sapphire were replicated on the surface of the PBT with exceptionally high fidelity. A solution of PS-b-PEO (number average molecular weight=26.5 kilograms/mole) in benzene was spin-coated onto the PBT having a replicated surface and onto a PBT film with a flat surface. These films were then solvent annealed with THF and water in a manner identical to that used previously. Unlike sapphire or silicon, the X-ray beam can easily pass through and is transmitted by the PBT. Consequently, transmission SAXS was used to characterize the ordering (see FIGS. 12 and 13). A diffuse scattering is observed that arises from the PBT substrate (see FIG. 13(B)). However, a very distinct ring pattern is also observed (indicated by the arrow in the FIG. 12(B), $q_B^*=0.186$ nm$^{-1}$) from the 47.6 nm thick film of PS-b-PEO on the surface of the flat PBT surface. This scattering is characteristic of many randomly oriented grains of the cylindrical microdomains. SFM measurements show that the microdomains are oriented parallel to the surface of the film. For the 47.6 nm thick PS-b-PEO film on the faceted PBT replica, reflections are observed (indicated by the arrow in the FIG. 12(C), $q_C^*=0.185$ nm$^{-1}$) at scattering vectors corresponding to $2\pi/nL$, where n is an integer corresponding to the order of the reflection and L is a separation distance between adjacent cylindrical microdomains in thin film. First and second order reflections are evident in this figure, but by measuring the scattering for a longer time, up to a fifth order reflection could be observed, characteristic of the high degree of lateral ordering of the microdomains. The narrow width of the reflection and azimuthal dependence of the scattering indicate that the scattering arises from a single grain of cylindrical microdomains with near-perfect lateral ordering over the area illuminated by the X-ray beam (1.0 millimeter by 0.7 millimeter). From the azimuthal dependence of the scattering, an orientation function value of 0.958 was obtained. When the area near the beamstop is enlarged (see FIG. 12(D)), streaks arising from the facets are observed (indicated by the arrow in the FIG. 12(D), $q_D^*$) where the direction of the streaks is exactly orthogonal to BCP patterns. Consequently, the cylindrical microdomains must be oriented orthogonal to the ridges. By translating the sample in the beam, multiple exposures were taken with identical results where, to within the accuracy of the translation, the orientation was preserved. These results indicated that the PS-b-PEO film consists of a single grain of highly oriented and highly aligned cylindrical microdomains that span the entire surface.

Because of its long-range order, the annealed block copolymer film comprising linear microdomains is useful for forming a nanopatterned surface comprising an array of islands, in which the center-to-center separation between nearest-neighbor islands corresponds to the center-to-center separation of nearest-neighbor linear microdomains.

Figure 14:
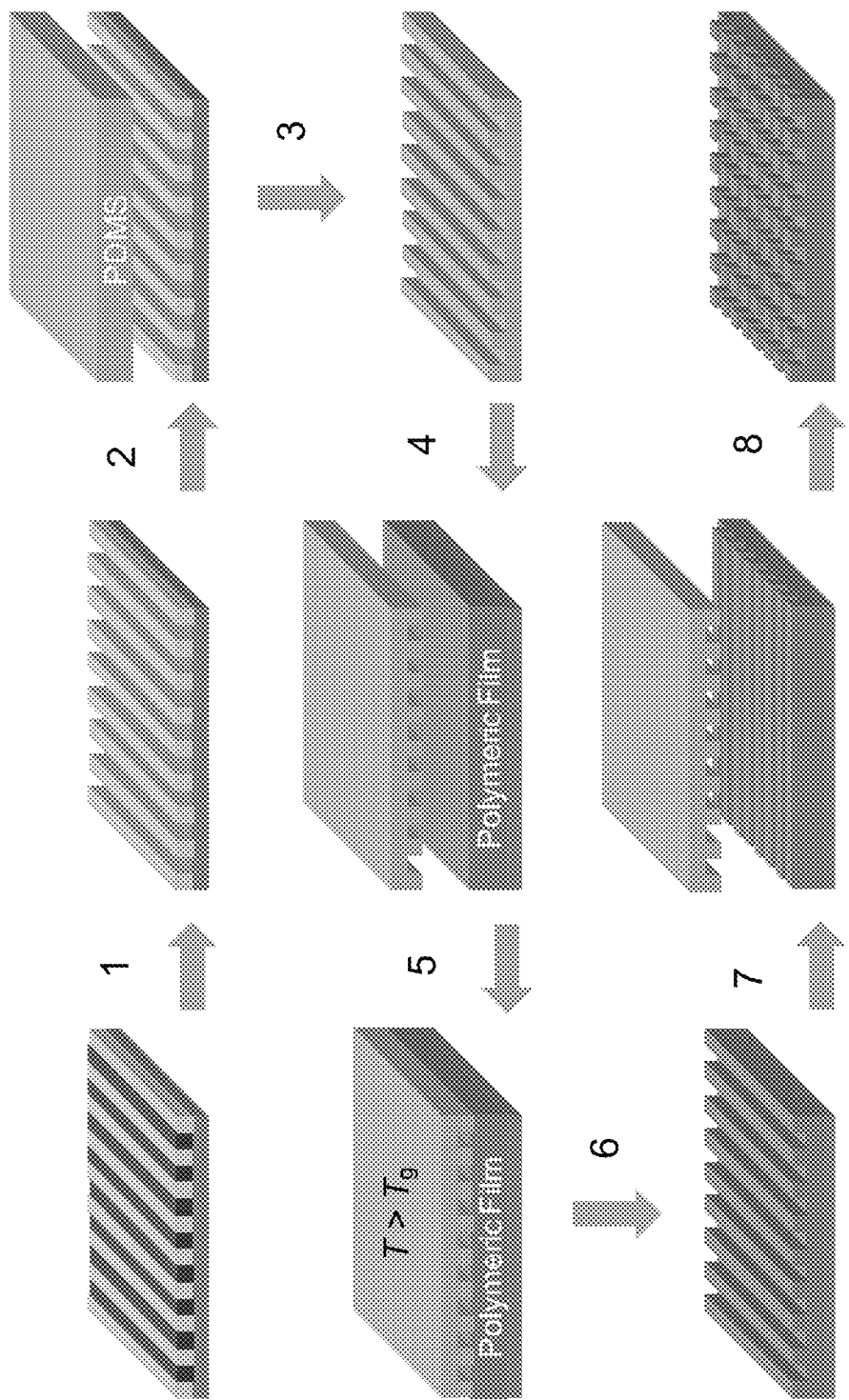
FIG. 14 depicts a stamp-turn-stamp nanoimprint method of forming a nanopatterned surface.

One process for generating a nanopatterned surface comprising an array of islands is depicted in FIG. 14. The process begins with an article comprising a substrate and an annealed block copolymer film comprising linear microdomains (upper left structure in FIG. 14). In a first step, the minor component of the block copolymer is either removed (e.g., by photochemical degradation of poly(methyl methacrylate)), or moved to the top of the major component by solvent reconstruction, thereby generating a modified block copolymer film comprising linear trenches (upper middle structure). In second and third steps, a polydimethylsiloxane (PDMS) precursor is cured (via chemical crosslinking) in contact with the modified block copolymer film to produce a crosslinked PDMS replica, which is then separated from the block copolymer film (and shown as the middle right structure). In fourth and fifth steps, the crosslinked PDMS replica is impressed into a supported polymeric film at a temperature, T, above the glass transition temperature, $T_g$, of its constituent polymer. In a sixth step, the crosslinked PDMS replica is separated from the line-patterned polymeric film (which is shown as the lower left structure). In a seventh step, the polymeric film is rotated 90° relative to the crosslinked PDMS replica. In an eighth step, the crosslinked PDMS replica is again impressed into the supported polymeric film and separated from the supported polymeric film, yielding a supported polymeric film with a nanopatterned surface comprising an array of islands (shown as the lower right structure).

Figure 15:
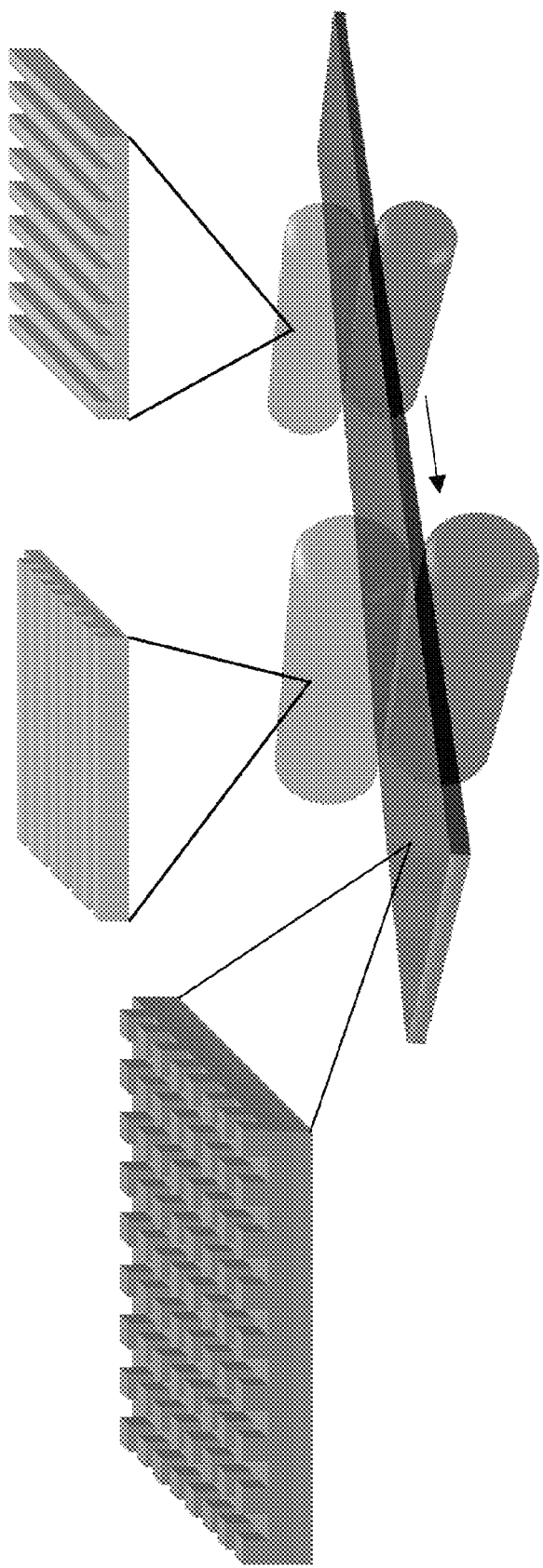
FIG. 15 depicts a roll-to-roll method of forming a nanopatterned surface.

Another process for generating a nanopatterned surface comprising an array of islands is depicted in FIG. 15. In this roll-to-roll process, a web of supported polymeric film is unwound from a first roller (not shown; to right of pictured components) and passes through two imprinting stations before being wound onto a second roller (not shown; to left of pictured components). The upper (above-the-web) rollers rotate clockwise, and the lower (below-the-web) rollers rotate counterclockwise. The surface of the upper roller at each imprinting station contacts the supported polymeric film and comprises nanoscale linear elevations corresponding to the linear microdomains of a block copolymer film (shown as enlargements of small areas of the rollers). For example, the surface of each upper roller can be a crosslinked PDMS replica of a modified block copolymer film, prepared as described above for FIG. 14. The orientation of the linear microdomains on the second upper roller is at a 90° angle to the orientation of the linear microdomains on the first upper roller. As such, a nanopatterned surface comprising an array of islands is created on the supported polymeric film. At each imprinting station, the polymeric film is heated to a temperature, T, above the glass transition temperature, $T_g$, of its constituent polymer.

In summary, the present methods provide a simple route to fabricating highly ordered and oriented line patterns of BCPs on both hard and soft substrates over arbitrarily large areas without using lithographic techniques. From GI-SAXS and transmission SAXS, the long-range ordering and orientation of the cylindrical microdomains are demonstrated and it was shown that there was one grain that spanned over the entire surface. Equally important, both the short and long wavelength waviness inherent to BCP microdomains are suppressed in a thermodynamically robust manner by enhancing the entropic contribution, forming essentially perfect line patterns. These films are ideal platforms for the fabrication of magnetic storage media, polarizing devices, and arrays of nanowires.

Experimental Details

METHODS. Thin films of block copolymers (BCPs) were prepared by spin-coating solutions of PS-b-PEO and benzene onto the substrates where the film thickness was controlled by adjusting the concentration of solution and the speed of spin coating. Solvent annealing was performed in THF and water vapor environment. A pre-swelling of the BCP film in water vapor was performed to prevent dewetting during the solvent annealing. This was followed by a solvent annealing in THF and water vapor to generate well-developed nanostructures. Grazing incidence small angle X-ray scattering (GI-SAXS) measurements were performed on the beamline 7.3.3 at the Advanced Light Source in the Lawrence Berkeley National Laboratory. The X-ray beam was delivered onto the sample at an angle above the critical angle of the polymer film ($\alpha_c$=0.16) but below the critical angle of the sapphire substrate ($\alpha_c$=0.28). 2D transmission X-ray scattering measurements were also performed on the beamline 7.3.3 at the Advanced Light Source at the Lawrence Berkeley National Laboratory. The wavelength of X-rays used was 1.23984 Å, and the scattered intensity was detected by using 2D charge-coupled device (CCD) camera having 2304×2304 pixels.

ORIENTATION FUNCTION (transmission SAXS). The integrated intensity of the first order reflection is plotted as a function of the azimuthal angle where the precipitous drop in intensity is evident. The orientation parameter, f, is given by $$\frac{3\langle\cos^2\Omega\rangle - 1}{2},$$

where $\Omega$ is the azimuthal angle and $\cos^2\Omega$ is $$\frac{\int I(\Omega)\cos^2\Omega\sin\Omega d\Omega}{\int I(\Omega)\sin\Omega d\Omega} = \frac{\sum I(\Omega)\cos^2\Omega\sin\Omega}{\sum I(\Omega)\sin\Omega}.$$

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A method of preparing a block copolymer film comprising a line pattern, comprising:
    forming a block copolymer film on a substrate surface comprising parallel facets; and
    annealing the block copolymer film to form an annealed block copolymer film comprising linear microdomains parallel to the substrate surface and orthogonal to the parallel facets;
    wherein the parallel facets of the substrate are characterized by a pitch, $\lambda$, having units of nanometers;
    wherein the block copolymer in bulk comprises a hexagonal array of cylindrical microdomains characterized by a center-to-center spacing, $L_2$, of adjacent cylindrical microdomains, wherein $L_2$ has units of nanometers; and
    wherein $\lambda/L_2$ is either less than or equal to 0.73 or greater than or equal to 1.4.

2. The method of claim 1, wherein the linear microdomains have a periodicity of about 15 to about 60 nanometers.

3. The method of claim 1, wherein the annealed block copolymer film has an order parameter, f, of at least 0.95 over an area of at least 0.5 millimeter$^2$.

4. The method of claim 1, wherein the annealed block copolymer film has an order parameter, f, over an area of at least 0.5 millimeter$^2$ that is greater than the corresponding order parameter for the substrate surface.

5. The method of claim 1, wherein the block copolymer film has a thickness of about $L_1$ to about $2L_1$, wherein $L_1$ is a center-to-center domain spacing of cylindrical microdomains in bulk block copolymer, and wherein $L_1$ has units of nanometers.

6. The method of claim 1, wherein the block copolymer comprises about 65 to about 80 volume percent of a major block and about 20 to about 35 volume percent of a minor block.

7. The method of claim 1, wherein the block copolymer film comprises a block copolymer selected from the group consisting of polystyrene-b-poly(ethylene oxide), polystyrene-b-poly(2-vinylpyridine), polystyrene-b-poly(4-vinylpyridine), polystyrene-b-polybutadiene, polystyrene-b-polydimethylsiloxane, polystyrene-b-polylactide, and polystyrene-b-poly(methyl methacrylate).

8. The method of claim 1, wherein the block copolymer film comprises a polystyrene-b-poly(ethylene oxide).

9. The method of claim 1, wherein the substrate consists essentially of a single crystal.

10. The method of claim 1, wherein the substrate is selected from the group consisting of crystalline silicon, doped crystalline silicon, and crystalline aluminum oxide.

11. The method of claim 1, wherein the substrate comprises a polymeric replica of a crystalline surface comprising parallel facets.

12. The method of claim 11, wherein the polymeric replica comprises a polymer selected from the group consisting of poly(ethylene terephthalate)s, poly(butylene terephthalate)s, polydimethylsiloxanes, polytetrafluoroethylenes, random copolymers of tetrafluoroethylene and hexafluoropropylene, and polyimides derived from pyromellitic dianhydride and 4,4'-oxydianiline.

13. The method of claim 1, wherein said annealing the block copolymer film comprises thermal annealing.

14. The method of claim 1, wherein said annealing the block copolymer film comprises solvent vapor annealing.

15. The method of claim 14, wherein the block copolymer comprises about 65 to about 80 volume percent of a major block and about 20 to about 35 volume percent of a minor block, and wherein said solvent vapor annealing comprises exposing the block copolymer film to a vapor of a solvent in which the minor block is more soluble than the major block.

16. The method of claim 14, wherein the block copolymer comprises a polystyrene-b-poly(ethylene oxide), and wherein said solvent vapor annealing comprises exposing the block copolymer film to a solvent vapor comprising water and tetrahydrofuran.

17. The method of claim 14, wherein the block copolymer comprises a polystyrene-b-poly(ethylene oxide), and wherein said solvent vapor annealing comprises exposing the block copolymer film to a first solvent vapor comprising water, then exposing the block copolymer film to a second solvent vapor comprising water and tetrahydrofuran.

18. The method of claim 14, wherein said solvent vapor annealing comprises exposing the block copolymer film to a solvent vapor for about 1 to about 4 hours at a temperature of about 15 to about 30° C.

19. The method of claim 1, wherein said annealing the block copolymer film comprises thermal annealing and solvent vapor annealing.

20. The method of claim 1, wherein $\lambda/L_2$ is less than or equal to 0.73.

21. The method of claim 1, wherein $\lambda/L_2$ is greater than or equal to 1.4.

22. The method of claim 1, wherein said annealing the block copolymer film comprises annealing the block copolymer film to form a first annealed block copolymer film comprising a hexagonal array of cylindrical microdomains having a major axis normal to the film, and further annealing the first annealed block copolymer film to form the annealed block copolymer film comprising linear microdomains parallel to the substrate surface and orthogonal to the parallel facets.

23. The method of claim 1, wherein the block copolymer film has a thickness of about $L_1$ to about $2L_1$, wherein $L_1$ is a center-to-center domain spacing of cylindrical microdomains in bulk block copolymer, and wherein $L_1$ has units of nanometers;

wherein the block copolymer film comprises a polystyrene-b-poly(ethylene oxide);

wherein the polystyrene-b-poly(ethylene oxide) comprises about 65 to about 80 volume percent of a polystyrene block and about 20 to about 35 volume percent of a poly(ethylene oxide) block;

wherein the substrate comprises crystalline aluminum oxide or a poly(butylene terephthalate) replica of a crystalline aluminum oxide surface;

wherein said annealing comprises exposing the block copolymer film to a solvent vapor comprising water and tetrahydrofuran for about 1 to about 4 hours at a temperature of about 15 to about 30° C.; and wherein the annealed block copolymer film has an order parameter, f, of at least 0.95 over an area of at least 0.5 millimeter.

* * * * *